United States Patent
Kim

(10) Patent No.: US 12,446,288 B2
(45) Date of Patent: Oct. 14, 2025

(54) SEMICONDUCTOR DEVICE AND METHOD FOR FABRICATING THE SAME

(71) Applicant: SK hynix Inc., Gyeonggi-do (KR)

(72) Inventor: Jun Sik Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 401 days.

(21) Appl. No.: 18/182,361

(22) Filed: Mar. 13, 2023

(65) Prior Publication Data

US 2024/0063277 A1    Feb. 22, 2024

(30) Foreign Application Priority Data

Aug. 19, 2022    (KR) .................. 10-2022-0104240

(51) Int. Cl.
*H10D 64/27* (2025.01)
*H10D 30/62* (2025.01)

(52) U.S. Cl.
CPC ....... *H10D 64/513* (2025.01); *H10D 30/6211* (2025.01)

(58) Field of Classification Search
CPC .................. H10D 30/6211; H10D 64/511–513
See application file for complete search history.

(56) References Cited

U.S. PATENT DOCUMENTS

| | | | |
|---|---|---|---|
| 9,502,526 B2 | 11/2016 | Jang | |
| 9,972,628 B1 | 5/2018 | Goswami et al. | |
| 11,101,273 B1 | 8/2021 | Huang et al. | |
| 2014/0015043 A1* | 1/2014 | Lee | H10D 64/513 257/331 |
| 2014/0110786 A1 | 4/2014 | Kim et al. | |
| 2015/0214314 A1* | 7/2015 | Oh | H10D 64/021 257/330 |
| 2015/0311297 A1* | 10/2015 | Im | H10B 12/09 257/331 |
| 2019/0067278 A1* | 2/2019 | Seo | H10D 62/115 |
| 2019/0221669 A1* | 7/2019 | Lee | H10B 12/0385 |
| 2019/0288114 A1* | 9/2019 | Kim | H10D 30/6211 |
| 2020/0266199 A1 | 8/2020 | Tsai et al. | |

* cited by examiner

Primary Examiner — Steven M Page
(74) Attorney, Agent, or Firm — IP & T GROUP LLP

(57) ABSTRACT

A semiconductor device includes: an isolation layer formed to define active regions including active fins in a substrate; gate trenches extending across the active fins and the isolation layer; and buried gates that fill the gate trenches, and include fin gates disposed on sidewalls of the active fins, active gates disposed over the active fins, and passing gates disposed over the isolation layer, wherein bottom surfaces of the passing gates are disposed at a higher level than bottom surfaces of the active gates, and bottom surfaces of the fin gates are disposed at a lower level than the bottom surfaces of the active gates.

23 Claims, 20 Drawing Sheets

SEMICONDUCTOR DEVICE AND METHOD FOR FABRICATING THE SAME

CROSS-REFERENCE TO RELATED APPLICATIONS

The present application claims priority of Korean Patent Application No. 10-2022-0104240, filed on Aug. 19, 2022, which is incorporated herein by reference in its entirety.

BACKGROUND

1. Field

Various embodiments of the present invention relate generally to a semiconductor device and, more particularly, to a semiconductor device including a buried gate, and a method for fabricating the semiconductor device.

2. Description of the Related Art

Recently, for increasing the integration degree of semiconductor devices, buried gates that include gate electrodes or word lines buried inside a semiconductor substrate have been introduced.

SUMMARY

Various embodiments of the present invention are directed to a semiconductor device with a buried gate exhibiting improved reliability. Various embodiments of the present invention are directed to an improved method for fabricating the semiconductor device.

In accordance with an embodiment of the present invention, a semiconductor device includes: an isolation layer formed to define active regions including active fins in a substrate; gate trenches extending across the active fins and the isolation layer; and buried gates that fill the gate trenches, and include fin gates disposed on sidewalls of the active fins, active gates disposed over the active fins, and passing gates disposed over the isolation layer, wherein bottom surfaces of the passing gates are disposed at a higher level than bottom surfaces of the active gates, and bottom surfaces of the fin gates are disposed at a lower level than the bottom surfaces of the active gates.

In accordance with another embodiment of the present invention, a semiconductor device includes: an isolation layer formed to define active regions including active fins in a substrate; gate trenches extending across the active fins and the isolation layer; and buried gates that fill the gate trenches, and include fin gates disposed on sidewalls of the active fins, active gates disposed over the active fins, and passing gates disposed over the isolation layer, wherein the passing gates include dielectric dummy electrodes whose bottom surfaces are disposed at a lower level than bottom surfaces of the active gates, bottom surfaces of the fin gates are disposed at a lower level than the bottom surfaces of the active gates, and the bottom surfaces of the dielectric dummy electrodes and the bottom surfaces of the fin gates are disposed at the same level.

In accordance with another embodiment of the present invention, a method for fabricating a semiconductor device includes: forming an isolation layer that defines active regions in the substrate and includes first isolation portions and second isolation portions; forming a gate trench extending across the active regions and the isolation layer; defining active fins below the gate trench by forming a height difference between the first isolation portions and the second isolation portions; and forming a buried gate that fills the gate trench, and includes fin gates disposed on sidewalls of the active fins, active gates disposed over the active fins, and passing gates disposed over the isolation layer. Bottom surfaces of the passing gates are disposed at a higher level than bottom surfaces of the active gates, and bottom surfaces of the fin gates are disposed at a lower level than the bottom surfaces of the active gates. Each of the active fins includes an upper surface, and a first sidewall and a second sidewall that are horizontally facing each other with the upper surface interposed therebetween, and the first sidewall and the fin gates horizontally overlap with each other, and the upper surface and the active gates vertically overlap with each other. Upper surfaces of the fin gates, the active gates, and the passing gates are disposed at the same level, the fin gates have a greater height than a height of the active gates, and the passing gates have a lower height than the height of the active gates. The first isolation portions are disposed below the fin gates, the second isolation portions are disposed below the passing gates, and the active fins are disposed between the first isolation portions and the second isolation portions. The upper surfaces of the active fins are disposed at a higher level than upper surfaces of the first isolation portions, and upper surfaces of the second isolation portions are disposed at a higher level than upper surfaces of the active fins. The first isolation portions include a single-layer structure of silicon oxide, and the second isolation portions include a double layer structure of silicon oxide and silicon nitride. Each of the active gates, the fin gates, and the passing gates includes: a first gate electrode; a second gate electrode; and a dipole inducing layer between the first gate electrode and the second gate electrode. The second gate electrode includes a material having a higher work function than a work function of the first gate electrode. The first gate electrode includes titanium nitride, and the second gate electrode includes titanium silicon nitride. The first gate electrode includes titanium nitride, and the second gate electrode includes titanium silicon nitride which is doped with a work function adjusting element, and the work function adjusting element includes phosphorus or arsenic. The dipole inducing layer includes a lanthanum-containing material. The forming of the gate trench extending across the active regions and the isolation layer includes: etching the active regions; etching the first and second isolation portions; and further etching the first isolation portions to form a stepped bottom surface profile.

In accordance with another embodiment of the present invention, a method for fabricating a semiconductor device includes: forming an isolation layer defining active regions on the substrate; forming a gate trench extending across the active regions and the isolation layer; defining active fins below the gate trench by partially recessing the isolation layer; forming a first gate electrode that fills the gate trench and includes fin electrodes disposed on sidewalls of the active fins, active electrodes disposed over the active fins, and passing electrodes disposed over the isolation layer; and replacing the passing electrodes of the first gate electrode with dielectric dummy electrodes. The replacing of the passing electrodes of the first gate electrode with dielectric dummy electrodes includes: selectively etching the passing electrodes of the first gate electrode to form cut portions; and filling the cut portions with a dielectric material to form the dielectric dummy electrodes. The method further comprising forming a dipole inducing layer over the dummy electrodes, the active electrodes, and the fin electrodes; and forming a second gate electrode over the dipole inducing layer.

In accordance with another embodiment of the present invention, a semiconductor device includes an isolation layer defining active regions including active fins disposed in a substrate; and buried gates extending across the active regions in the substrate, wherein the buried gates include a buried fin gate disposed between sidewalls of two adjacent active fins, buried active gates disposed over the two adjacent active fins, and buried passing gates disposed over the isolation layer, and wherein bottom surfaces of the buried passing gates, the buried active gates and the buried fin gates form a stepped structure.

DETAILED DESCRIPTION

Figure 1:
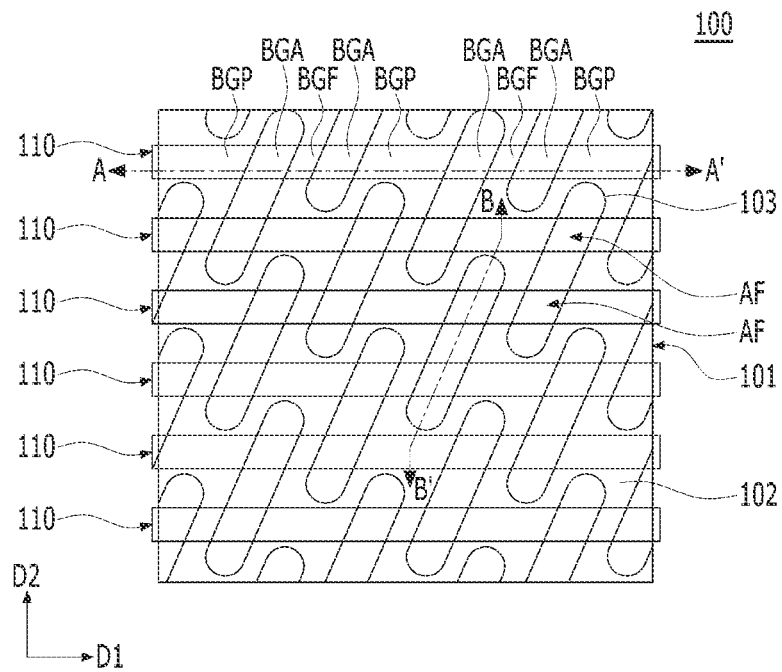
FIG. 1 is a plan view schematic illustrating the constituent elements of a semiconductor device in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also a case where a third layer exists between the first layer and the second layer or the substrate.

In some embodiments of the present invention described below a structure is disclosed that is capable of reducing the influence of a passing gate (or a password line), which is the largest factor among the factors that cause row hammer in a buried gate structure. Row hammer refers to the phenomenon where data stored in a capacitor operated by a main gate are distorted when a passing gate adjacent to the main gate operates continuously. In other words, when the passing gate is turned on, electrons stored in the capacitor adjacent to the main gate may migrate and become trapped at the interface between an isolation layer and an active region adjacent to the passing gate. When the passing gate is in an OFF state, some of the discharged electrons may re-combine with holes or electrons passing through a potential barrier of the main gate distorting the data. Row hammer may cause Gate-Induced Drain Leakage (GIDL), deteriorating the reliability of the semiconductor devices.

In some embodiments, it is possible to suppress an increase in the resistance of a buried gate and deterioration in a refresh rate at the same time by using a low work function electrode as a material of the buried gate.

In some embodiments, the heights of the active fins may be formed asymmetrically in order to suppress the row hammer.

In some embodiments, in order to maximize the low work function, the concentration of a work function adjusting element of the low work function electrode may be increased. Also, in order to maximize the low work function, the volume of the low work function electrode may be increased more than the volume of the high work function electrode.

Figure 2A:
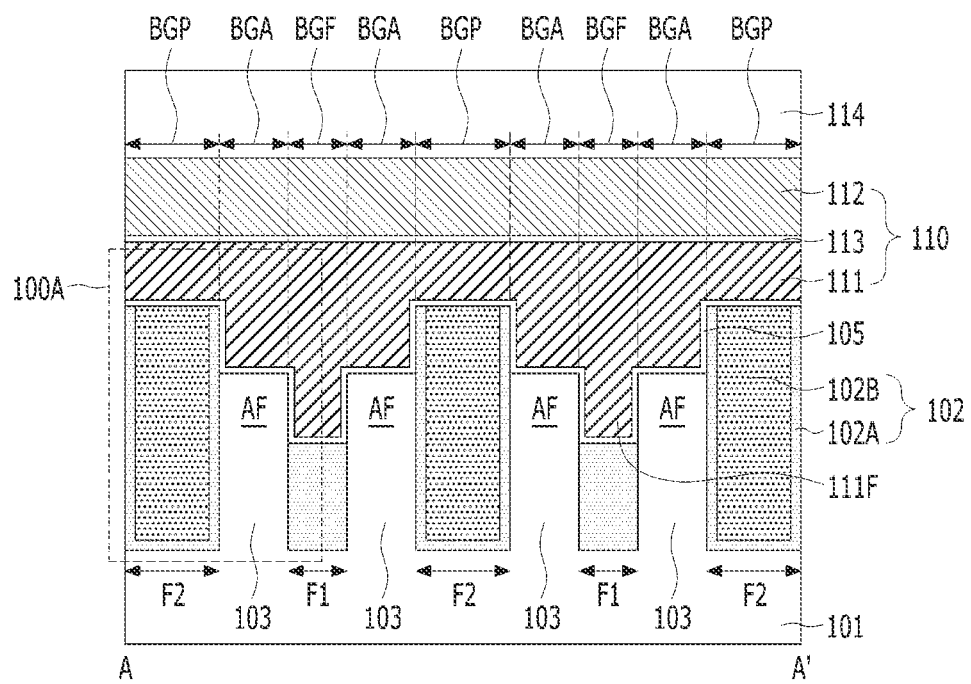
FIG. 2A is a cross-sectional view schematic of the constituent elements taken along a line A-A' shown in FIG. 1.
Figure 2B:
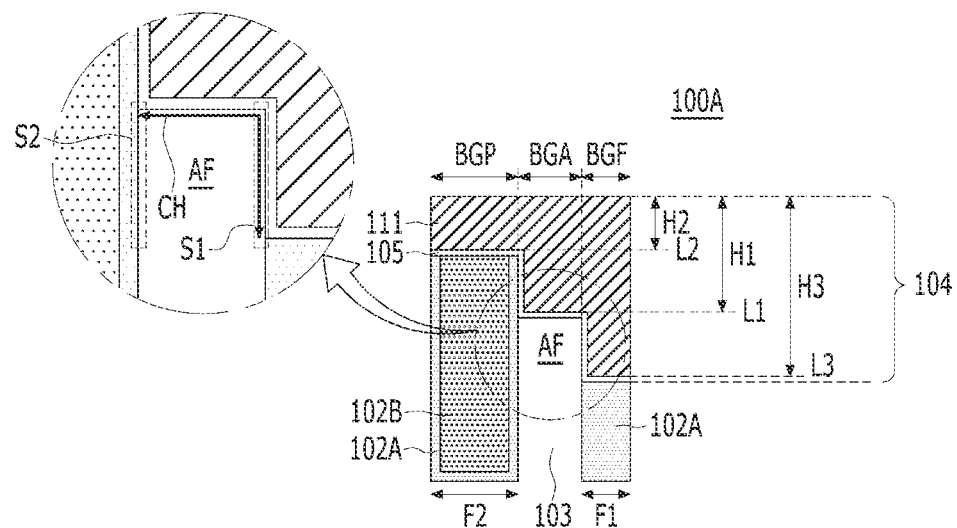
FIG. 2B is an enlarged view illustrating a portion 100A of FIG. 2A.
Figure 3:
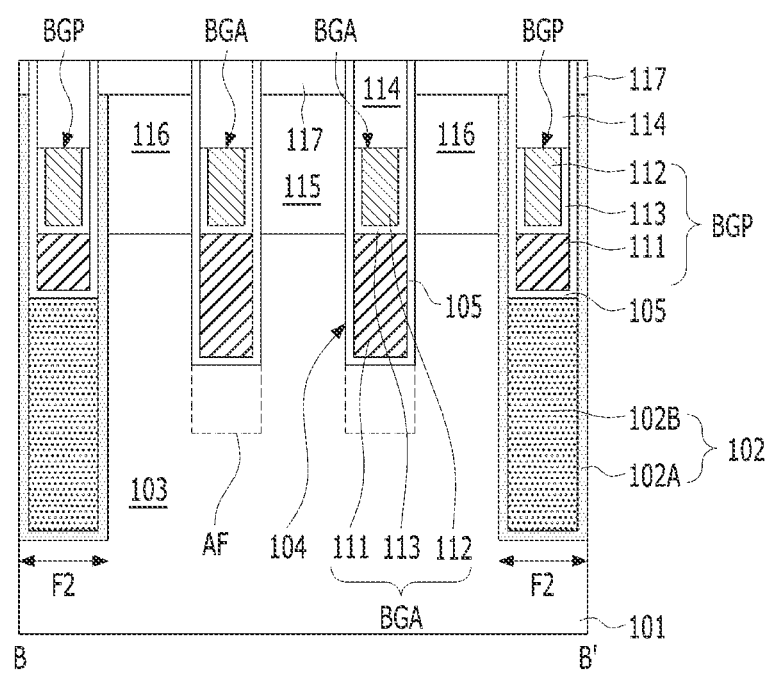
FIG. 3 is a cross-sectional view schematic of the constituent elements taken along a line B-B' shown in FIG. 1.

FIG. 1 is a plan view schematic illustrating the constituent elements of a semiconductor device in accordance with an embodiment of the present invention. FIG. 2A is a cross-sectional view schematic of the constituent elements taken along a line A-A' shown in FIG. 1. FIG. 2B is an enlarged view illustrating a portion 100A of FIG. 2A. FIG. 3 is a cross-sectional view schematic of the constituent elements taken along a line B-B' shown in FIG. 1.

Referring to FIGS. 1, 2A, 2B and 3, the semiconductor device 100 may include a substrate 101, an isolation layer 102, a plurality of active regions 103, and a plurality of buried gates 110.

The substrate 101 may include a semiconductor material, an oxide semiconductor material, or a compound semiconductor material. The substrate 101 may include silicon (Si), germanium (Ge), SiGe, SiC, GaAs, InAs, InP, IGZO, or a combination thereof. According to another embodiment of the present invention, the substrate 101 may include a Silicon-On-Insulator (SOI) structure. A hard mask layer 117 may be formed over the substrate 101.

The isolation layer 102 may define the active regions 103 in the substrate 101. The buried gates 110 may extend across a plurality of active regions 103. The substrate 101 may further include a plurality of gate trenches 104. Each of the buried gates 110 may be disposed in a corresponding one of the gate trenches 104. The gate dielectric layers 105 may be formed over the gate trenches 104. The buried gates 110 may be shaped to partially fill the gate trenches 104 over the gate dielectric layers 105. Each of the active regions 103 may include an active fin region simply referred to as an active fin AF. Portions of the buried gates 110 may cover the active fins AF. The gate trenches 104 may be formed by etching the substrate 101 using the hard mask layer 117.

The gate dielectric layer 105 may be conformally formed on the bottom surfaces and sidewalls of the gate trenches 104. The gate dielectric layer 105 may include silicon oxide, silicon nitride, silicon oxynitride, a high-k material, or a combination thereof. The high-k material may have a greater dielectric constant than silicon oxide. For example, the high-k material may include a material having a dielectric constant of approximately 3.9 or more. To take another example, the high-k material may include a material having a dielectric constant greater than approximately 10. To take yet another example, the high-k material may include a material having a dielectric constant of approximately 10 to 30. The high-k material may include at least one metallic element. The high-k material may include a hafnium-containing material. The hafnium-containing material may include hafnium oxide, hafnium silicon oxide, hafnium silicon oxynitride, or a combination thereof. According to another embodiment of the present invention, the gate dielectric layer 105 may include lanthanum oxide, lanthanum aluminum oxide, zirconium oxide, zirconium silicon oxide, zirconium silicon oxynitride, aluminum oxide, or a combination thereof. As the gate dielectric layer 105, other known high-k materials may be selectively used. The gate dielectric layer 105 may include a metal oxide.

The buried gates 110 may extend across a plurality of the active regions 103 and the isolation layer 102 simultaneously. The buried gates 110 may extend in a first direction D1, and the buried gates 110 neighboring in a second direction D2 may be disposed at regular intervals from each other. Each of the buried gates 110 may 11I include a first gate electrode 111, a second gate electrode 112, and a dipole inducing layer 113 between the first and second gate electrodes 111 and 112.

A capping layer 114 may be formed over the buried gates 110. The capping layer 114 may protect the buried gates 110. The capping layer 114 may include a dielectric material. The capping layer 114 may include silicon nitride, silicon oxynitride, or a combination thereof. According to another embodiment of the present invention, the capping layer 114 may include a combination of silicon nitride and silicon oxide. The capping layer 114 may include a stack of a silicon nitride liner and a Spin-On Dielectric material (SOD).

First and second doped regions 115 and 116 may be formed on opposite lateral sides of each buried gate 110. The first and second doped regions 115 and 116 may be formed in the active region 103. The first and second doped regions 115 and 116 are regions doped with a conductive dopant. For example, the conductive dopant may include phosphorus (P), arsenic (As), antimony (Sb), or boron (B). The first and second doped regions 115 and 116 may be doped with dopants of the same conductivity type. The first and second doped regions 115 and 116 may be referred to as first and second source/drain regions, respectively.

The buried gates 110 may include active gates BGA, passing gates BGP, and fin gates BGF. The active gates BGA may traverse the active regions 103, and the passing gates BGP and the fin gates BGF may traverse the isolation layer 102.

The active gates BGA may be disposed between the passing gates BGP and the fin gates BGF. In the first direction D1, the passing gates BGP, the active gates BGA, the fin gates BGF, and the active gates BGA may be horizontally repeated. The isolation layer 102 may be disposed below each of the passing gates BGP and the fin gates BGF. The active fins AF may be disposed below the active gates BGA, and the gate dielectric layers 105 may be disposed between the active fins AF and the active gates BGA. The gate dielectric layers 105 may be disposed between the passing gates BGP and the isolation layer 102. The gate dielectric layers 105 may be disposed between the fin gates BGF and the isolation layer 102. The fin gates BGF may include a gap-fill portion 111F disposed between the neighboring active fins AF. The gap-fill portion 111F may horizontally overlap with a portion of the sidewalls of the active fins AF.

The first gate electrodes 111 of the active gates BGA may have a first height H1, and the first gate electrodes 111 of the passing gates BGP may have a second height H2. The first gate electrodes 111 of the fin gates BGF may have a third height H3. The first height H1 may be greater than the second height H2, and the third height H3 may be greater than the first height H1.

The bottom surface L1 of the active gates BGA may be disposed at a lower level than the bottom surfaces L2 of the passing gates BGP. The bottom surface L3 of the fin gates BGF may be disposed at a lower level than the bottom surfaces L1 of the active gates BGA. The bottom surface L3 of the fin gates BGF may be disposed at a lower level than the bottom surfaces L2 of the passing gates BGP.

Each of the buried gates 110 may include a first gate electrode 111, a second gate electrode 112, and a dipole inducing layer 113 between the first and second gate electrodes 111 and 112. The active gates BGA, passing gates BGP, and fin gates BGF may include a first gate electrode 111, a second gate electrode 112, and a dipole inducing layer 113 between the first and second gate electrodes 111 and 112, individually.

The first gate electrodes 111 of the passing gates BGP and the fin gates BGF may extend from the first gate electrodes 111 of the active gates BGA. The first gate electrodes 111 of the passing gates BGP, the fin gates BGF, and the active gates BGA may be formed of the same material and they may have an integrated structure.

The second gate electrodes 112 of the passing gates BGP and the fin gates BGF may extend from the second gate electrodes 112 of the active gates BGA. The second gate electrodes 112 of the passing gates BGP, the fin gates BGF, and the active gates BGA may be formed of the same material and they may have an integrated structure.

The dipole inducing layers 113 of the passing gates BGP and the fin gates BGF may extend from the dipole inducing layers 113 of the active gates BGA. The dipole inducting layers 113 of the passing gates BGP, the fin gates BGF, and the active gates BGA may be formed of the same material and they may have an integrated structure.

The first and second gate electrodes 111 and 112 may include a metal-based material. The first and second gate electrodes 111 and 112 may include a metal or a metal nitride. The first and second gate electrodes 111 and 112 may be formed of tungsten, titanium nitride, tantalum nitride, titanium silicon nitride (TiSiN), silicon (Si)-doped titanium nitride (TiN) (TSN), or a combination thereof. According to some embodiments of the present invention, the first gate electrode 111 may be formed of titanium nitride (TiN), and the second gate electrode 112 may be formed of silicon-doped titanium nitride (TSN). To maximize a low work function, the second gate electrode 112 may further include a work function adjusting element. The work function adjusting element may include phosphorus (P) or arsenic (As). For example, the second gate electrode 112 may be formed of phosphorus-doped and silicon-doped titanium nitride (Ph-doped TSN). The first gate electrode 111 may also include a work function adjusting element. The first and second gate electrodes 111 and 112 may include the same work function adjusting element, and the concentration of the work function adjusting element may be higher in the second gate electrode 112 than in the first gate J15; electrode 111. As a method of doping the second gate electrode 112 with the work function adjusting element, a gas-phase deposition method, an ion beam implantation method, or a plasma doping method (PLAD) may be used.

In order to maximize the low work function, the volume of the second gate electrode 112 may be increased compared to that of the first gate electrode 111.

According to another embodiment of the present invention, the first gate electrode 111 may be formed of a high work function material, and the second gate electrode 112 may be formed of a low work function material. The high work function material may be a material having a work function value of approximately 4.5 eV or more, and the low work function material may be a material having a work function value lower than approximately 4.5 eV.

The dipole inducing layer 113 may include a material whose areal density of oxygen atoms is lower than that of the gate dielectric layer 105. Due to the difference in the areal density of oxygen atoms, the dipole inducing layer 113 and the gate dielectric layer 105 may generate dipoles in such a manner that the work function is decreased. The dipole may decrease an effective work function value of the second gate electrode 112. Accordingly, the dipole inducing layer 113 may be referred to as a 'low work function liner'.

The dipoles may be generated through the following mechanism. The areal density of oxygen atoms in the dipole inducing layer 113 may be lower than the areal density of oxygen atoms in the gate dielectric layer 105. Oxygen atoms of the gate dielectric layer 105 may diffuse into the dipole inducing layer 113 due to the difference in the areal density of oxygen atoms. By the diffusion of oxygen atoms, the gate dielectric layer 105 may be positively charged, and the dipole inducing layer 113 may be negatively charged. As described above, dipoles may be induced at the interface between the positively charged gate dielectric layer 105 and the negatively charged dipole inducing layer 113. When the dipoles are induced, the energy band of the second gate electrode 112 may be raised, whereby the second gate electrode 112 has a decreased work function. After all, as the work function of the second gate electrode 112 decreases, the gate-induced drain leakage GIDL may be suppressed. The gate dielectric layer 105 may include silicon oxide ($SiO_2$), and the dipole inducing layer 113 may be formed of a material having a lower areal density of oxygen atoms than silicon oxide. The dipole inducing layer 113 may include a metal atom. The dipole inducing layer 113 may include a metal oxide. The dipole inducing layer 113 may include a metal oxide monolayer. The dipole inducing layer 113 may include lanthanum atoms. The dipole inducing layer 113 may include lanthanum oxide or a lanthanum oxide monolayer. The lanthanum atoms may be referred to as a 'dipole inducing species'. For example, the areal density of oxygen atoms of lanthanum oxide with respect to silicon oxide ($SiO_2$) may be approximately 0.77. According to another embodiment of the present invention, the dipole inducing layer 113 may include yttrium oxide ($Y_2O_3$), germanium oxide ($GeO_2$), lutetium oxide ($Lu_2O_3$), or strontium oxide (SrO).

The isolation layer 102 may include silicon oxide, silicon nitride, or a combination thereof. The isolation layer 102 may include a first isolation layer 102A and a second isolation layer 102B. The first isolation layer 102A and the second isolation layer 102B may be formed of different materials. Each of the first isolation layer 102A and the second isolation layer 102B may include silicon oxide, silicon nitride, or a combination thereof. For example, the first isolation layer 102A may be of silicon oxide, and the second isolation layer 102B may be of silicon nitride.

The isolation layer 102 may include a plurality of first isolation portions F1 and a plurality of second isolation portions F2. The first isolation portions F1 and the second isolation portions F2 may be alternately repeated in the first direction D1. The first isolation portions F1 may be disposed below the fin gates BGF of the buried gates 110, and the second isolation portions F2 may be disposed below the passing gates BGP of the respective buried gates 110. The first isolation portions F1 may be referred to as a narrow isolation layer, and the second isolation portions F2 may be referred to as a wide isolation layer. The first isolation portions F1 may have a single-layer structure of the first isolation layer 102A, and the second isolation portions F2 may have a double layer structure of the first isolation layer 102A and the second isolation layer 102B.

A single-layer structure of the first isolation layer 102A may be disposed below the fin gates BGF of the individual buried gates 110, and a double-layer structure of the first isolation layer 102A and the second isolation layer 102B may be disposed below the passing gates BGP of the buried gates 110.

Since the second isolation portion F2 is formed in a protruding shape, the passing gates BGP may be formed to be shallower than the active fins AF, thereby suppressing the row hammer. In other words, since the passing gates BGP move away from the active fins AF to reduce the concentration of trapped electrons, the row hammer may be suppressed.

The upper surfaces of the active fins AF may be disposed at a lower level than the upper surface of the buried gate 110. The upper surface of the buried gate 110 may be disposed at a lower level than the upper surface of the capping layer 114. The upper surfaces of the first isolation portions F1 may be disposed at a lower level than the upper surfaces of the second isolation portions F2. The first isolation portions F1 may be referred to as recessed isolation portions, and the second isolation portions F2 may be referred to as protruding isolation portions. The active fins AF may be disposed between the first isolation portions F1 and the second isolation portions F2.

The active fins AF may include first sidewalls S1 that are exposed by the first isolation portions F1, and second sidewalls S2 that are covered by the second isolation portions F2. The first sidewalls S1 may be referred to as exposed sidewalls, and the second sidewalls S2 may be referred to as covered sidewalls.

The first sidewalls S1 and the second sidewalls S2 of the active fins AF may have an asymmetrically exposed structure due to the isolation layer 102. Due to the asymmetrically exposed structure, the active fins AF may provide an asymmetric channel CH between the first isolation portion F1 and the second isolation portion F2. The upper surfaces of the active fins AF may be disposed at a lower level than the upper surfaces of the second isolation portions F2, and the upper surfaces of the active fins AF may be disposed at a higher level than upper surfaces of the first isolation portions F1. The active fins AF whose upper surfaces are higher than the upper surfaces of the first isolation portions F1 and lower than the upper surfaces of the second isolation portions F2 may be referred to as 'negative active fins'. As a comparative example, when the upper surfaces of the active fins AF are higher than the upper surfaces of the first isolation portions F1 and the upper surfaces of the second isolation portions F2, the active fins AF may be called positive active fins.

As described above, the bottom surface profile of the gate trench 104 has a non-flat shape by the first isolation portion F1, the second isolation portion F2, and the active fins AF. The non-flat shape may include a stepped bottom surface profile.

Referring to FIGS. 1, 2A, 2B, and 3, the bottom surfaces L3 of the fin gates BGF may be disposed at a lower level than the bottom surfaces L2 of the passing gates BGP. Also, the bottom surfaces L3 of the fin gates BGF may be disposed at a lower level than the bottom surfaces L1 of the active gates BGA. The bottom surfaces L1 of the active gates BGA may be disposed at a lower level than the bottom surfaces L2 of the passing gates BGP. The fin gates BGF and the active gates BGA may define an asymmetric channel CH in the active fins AF. Since the passing gates BGP are spaced apart from the active fins AF, they may not substantially affect the formation of the channel.

The fin gates BGF whose bottom surfaces L3 are lower than the bottom surfaces L1 of the active gates BGA may be formed over the first isolation portions F1 of the isolation layer 102 in which gate (or word line) interference between the neighboring cells does not occur. Accordingly, since the channel length is secured by the fin gates BGF, the driving current for transistors may be increased and the operation characteristics may be improved.

FIGS. 4A to 4K are cross-sectional view schematics illustrating an example of a method for fabricating the semiconductor device shown in FIG. 1. FIGS. 4A to 4K are cross-sectional view schematics taken along the line A-A' illustrating an example of a method for fabricating the semiconductor device shown in FIG. 1. FIGS. 5A to 5K are cross-sectional view schematics taken along the line B-B' illustrating an example of a method for fabricating the semiconductor device shown in FIG. 1.

Figure 4A:
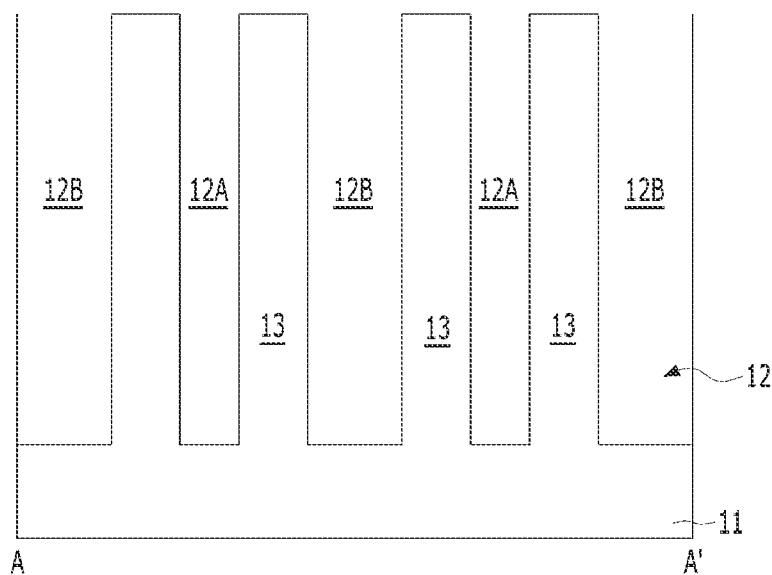
FIGS. 4A to 4K are cross-sectional view schematics taken along the line A-A' illustrating an example of a method for fabricating the semiconductor device shown in FIG. 1.
Figure 5A:
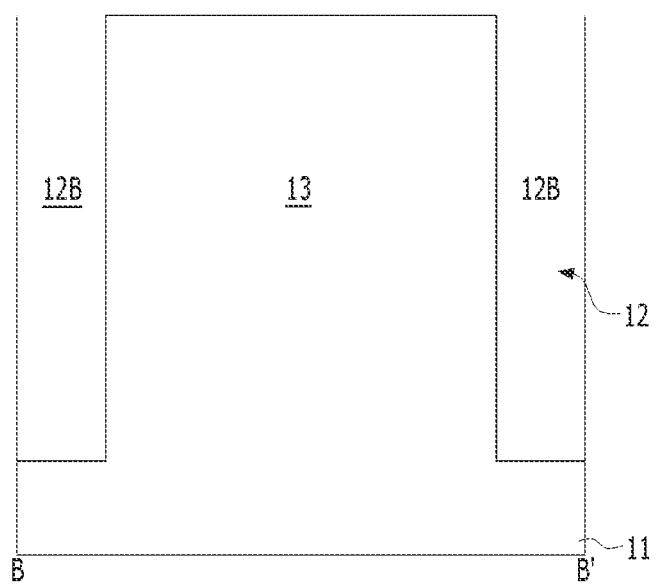
FIGS. 5A to 5K are cross-sectional view schematics taken along the line B-B' illustrating an example of a method for fabricating the semiconductor device shown in FIG. 1.

Referring to FIGS. 4A and 5A, an isolation trench 12 and active regions 13 may be formed in a substrate 11. The isolation trench 12 may include first portions 12A having a first width and second portions 12B having a second width that is wider than the first width. The process for forming the isolation trench 12 may include a shallow trench isolation (STI) process. For example, the substrate 11 may be etched to form the isolation trench 12. The substrate 11 may be a material appropriate for semiconductor processing. The substrate 11 may include a semiconductor material, an oxide semiconductor material, a compound semiconductor material, or a combination thereof. According to some embodiments of the present invention, the substrate 11 may include a silicon substrate. The first portions 12A of the isolation trench 12 may be referred to as narrow trenches, and the second portions 12B may be referred to as wide trenches.

Figure 4B:
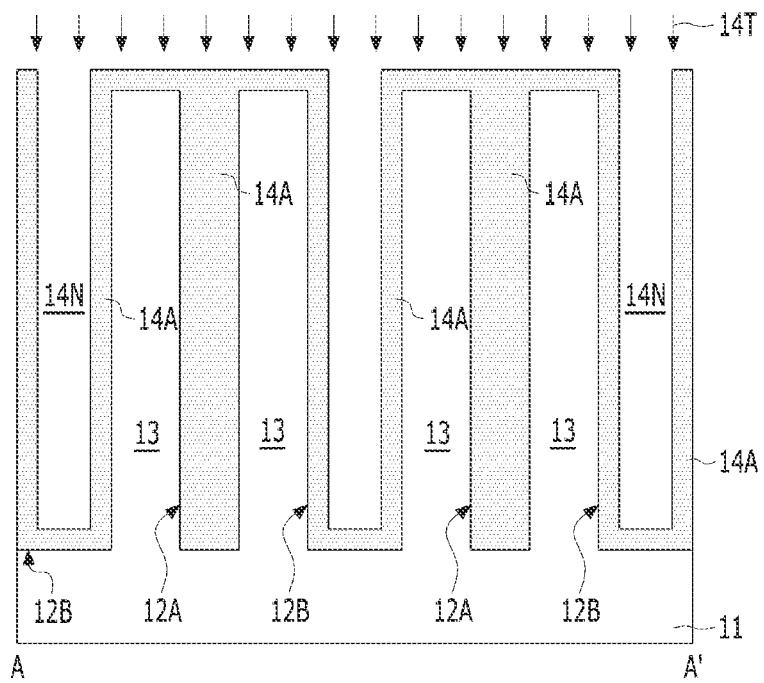
Figure 5B:
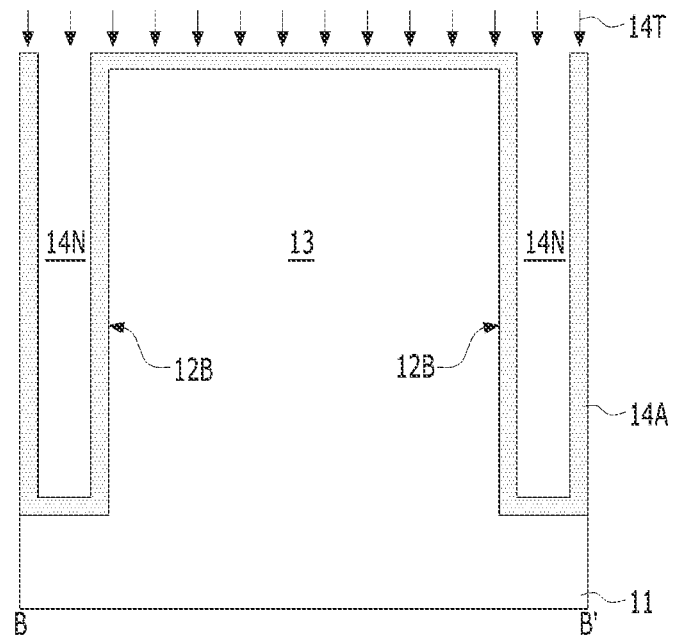

Referring to FIGS. 4B and 5B, a first isolation material layer 14A may be formed over the isolation trench 12. The first isolation material layer 14A may fill the first portions 12A of the isolation trench 12 and may conformally cover the second portions 12B of the isolation trench 12, thus forming narrow openings 14N in the second portions 12B of the isolation trench 12. The first isolation material layer 14A may include silicon oxide, silicon nitride, or a combination thereof. The first isolation material layer 14A may have an etch selectivity with respect to the substrate 11. According to some embodiments of the present invention, the first isolation material layer 14A may include silicon oxide.

Subsequently, a thinning process 14T or a trimming process of the first isolation material layer 14A may be performed. The thinning process 14T of the first isolation material layer 14A may include a wet dip-out process. The wet dip-out process may be performed using hydrofluoric acid (HF), which makes it possible to selectively etch the first isolation material layer 14A.

Figure 4C:
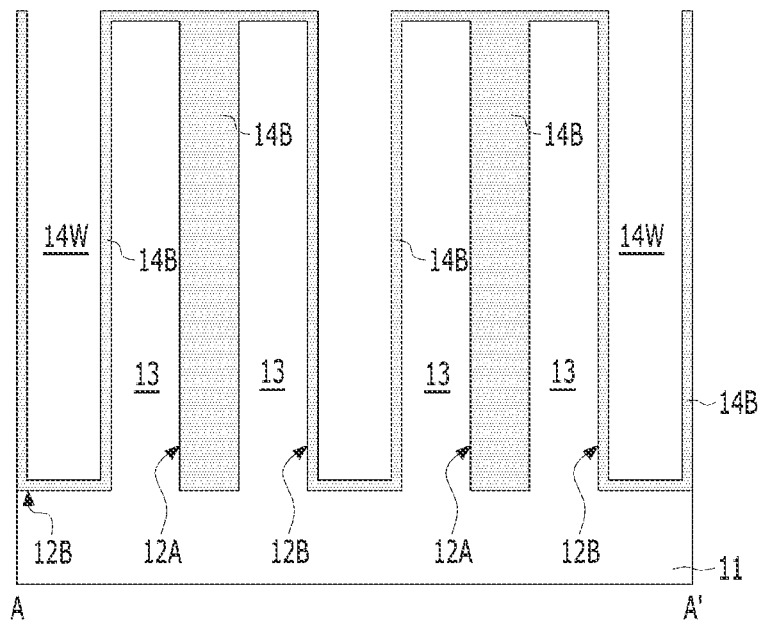
Figure 5C:
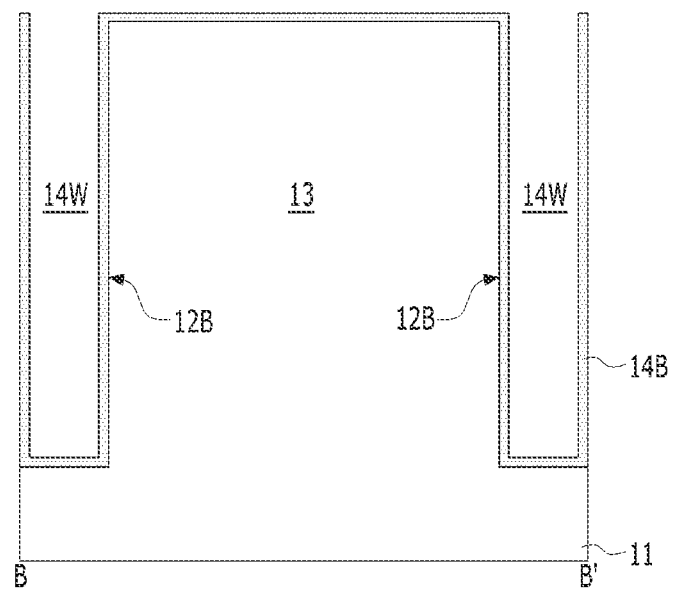

After the thinning process 14T of the first isolation material layer 14A, as illustrated in FIGS. 4C and 5C, a thin first isolation material layer 14B may be formed. The thin first isolation material layer 14B may fill the first portions 12A of the isolation trench 12, and may conformally cover the second portions 12B of the isolation trench 12. The thin first isolation material layer 14B may define wide openings 14W in the second portions 12B of the isolation trench 12. The wide openings 14W may have a larger volume than the narrow openings 14N. As the wide openings 14W are formed, the space to be filled with the subsequent second isolation material layer 15A may be widened.

Figure 4D:
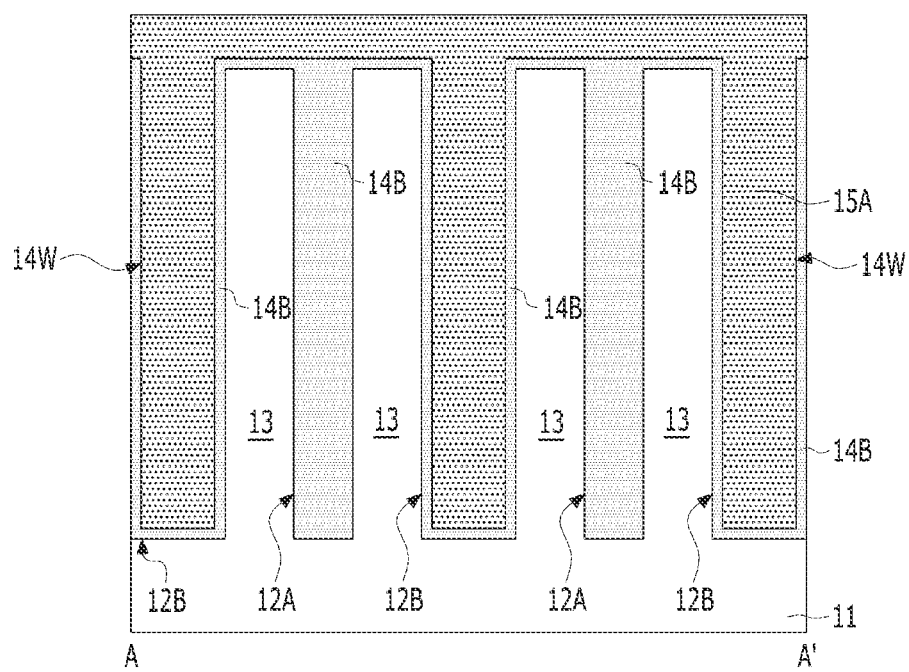
Figure 5D:
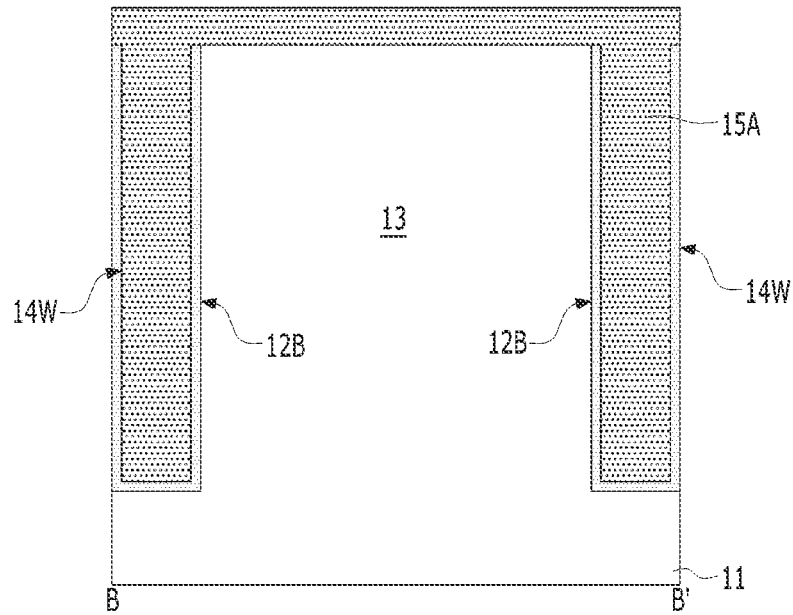

Referring to FIGS. 4D and 5D, a second isolation material layer 15A may be formed over the thin first isolation material layer 14B. The second isolation material layer 15A may fill the wide openings 14W over the thin first isolation material layer 14B. The second isolation material layer 15A may include silicon oxide, silicon nitride, or a combination thereof. The second isolation material layer 15A may have an etch selectivity with respect to the substrate 11 and the thin first isolation material layer 14B. According to some embodiments of the present invention, the second isolation material layer 15A may include silicon nitride.

Figure 4E:
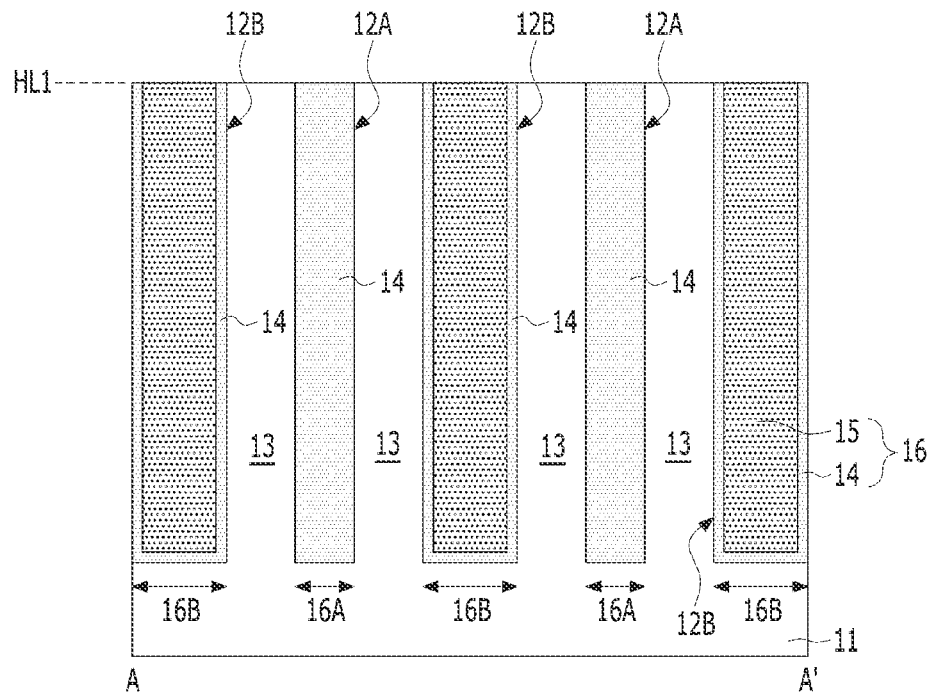
Figure 5E:
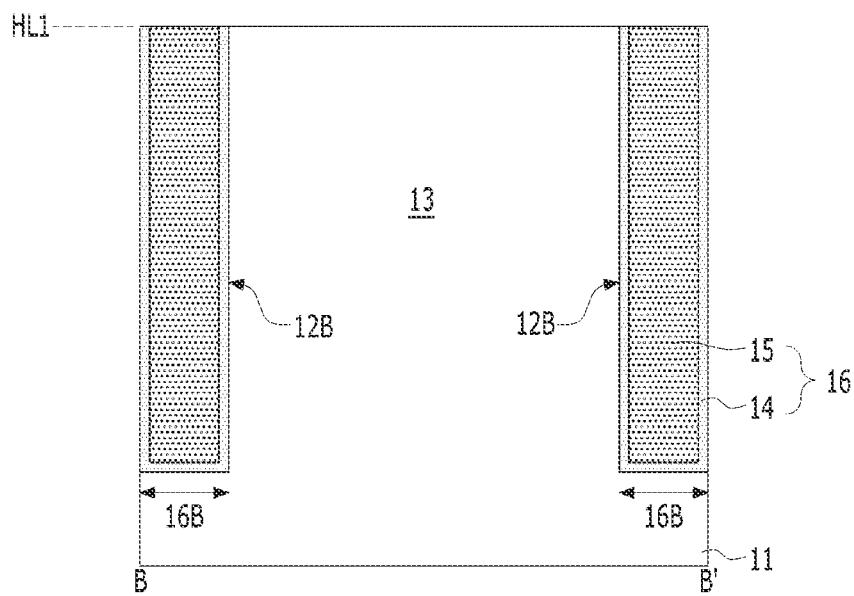

Referring to FIGS. 4E and 5E, the thin first isolation material layer 14B and the second isolation material layer 15A may be selectively removed to form an isolation layer 16. A process for forming the isolation layer 16 may include a planarization process, such as Chemical Mechanical Polishing (CMP). The isolation layer 16 may include a first isolation layer 14 and a second isolation layer 15. The first isolation layer 14 may be formed by a planarization process of the thin first isolation material layer 14B, and the second isolation layer 15 may be formed by a planarization process of the second isolation material layer 15A.

The first isolation layer 14 and the second isolation layer 15 may be formed of different materials. The first isolation layer 14 and the second isolation layer 15 may have different etch selectivity with respect to the substrate 11. The first isolation layer 14 may be formed of silicon oxide, and the second isolation layer 15 may be formed of silicon nitride. The isolation layer 16 may fill the first portions 12A and the second portions 12B of the isolation trench 12. The first portions 12A of the isolation trench 12 may be filled with a single layer of the first isolation layer 14, and the second portions 12B of the isolation trench 12 may be filled with a double layer of the first isolation layer 14 and the second isolation layer 15. The first isolation layer 14 may be referred to as a liner layer, and the second isolation layer 15 may be referred to as a gap-fill layer.

The isolation layer 16 may include first isolation portions 16A and second isolation portions 16B. The first isolation portions 16A may fill the first portions 12A of the isolation trench 12, and the second isolation portions 16B may fill the second portion 12B of the isolation trench 12. The first isolation portions 16A may include a single layer of the first isolation layer 14, and the second isolation portions 16B may include a double layer of the first isolation layer 14 and the second isolation layer 15.

The isolation layer 16 may insulate the neighboring active regions 13 from each other. Each of the active regions 13 may all have the same shape. From the perspective of a top view, each active region 13 may have an island-shape. The active regions 13 may extend in an oblique direction. Each active region 13 may have a long axis and a short axis. The length of the long axis may be greater than the length of the short axis.

The upper surface of the isolation layer 16 may be disposed at the same level as the upper surface of the substrate 11, that is, the upper surface of the active regions 13. For example, the upper surface of the isolation layer 16 and the upper surface of the active regions 13 may be aligned to a first horizontal level HL1.

Figure 4F:
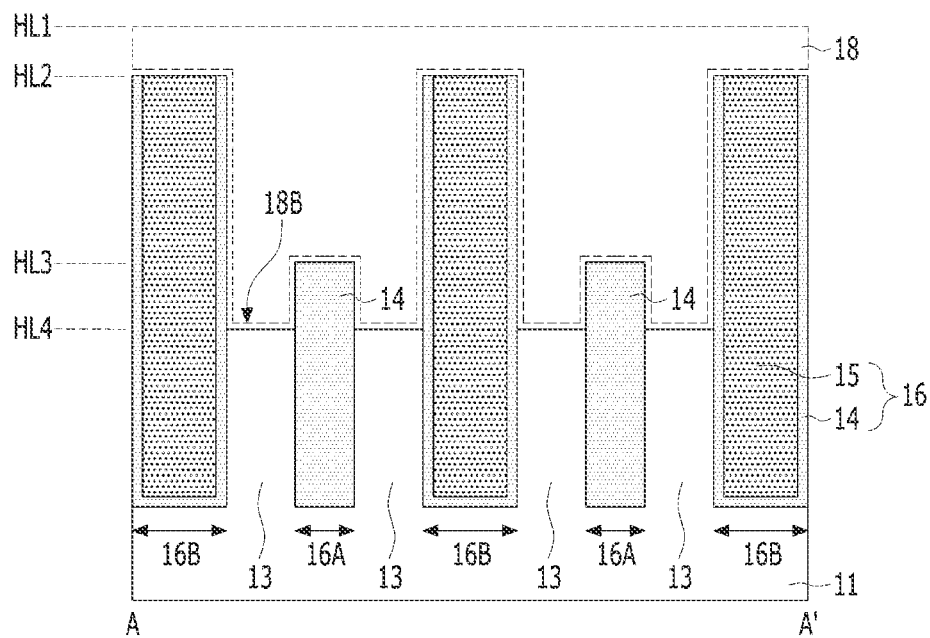
Figure 5F:
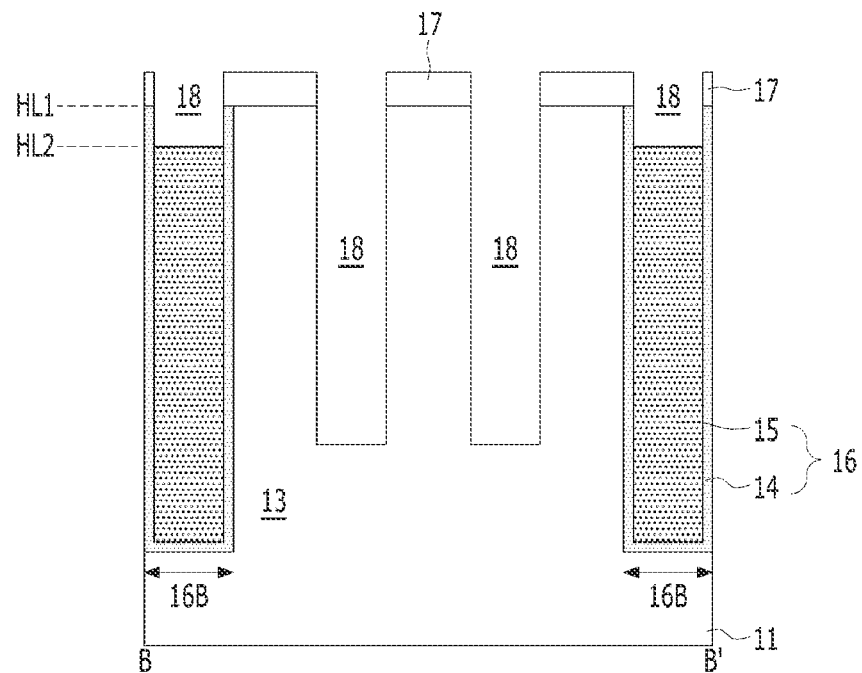

Referring to FIGS. 4F and 5F, the substrate 11 may be etched using a hard mask layer 17 to form a gate trench 18. The hard mask layer 17 may have an etch selectivity with respect to the substrate 11. The hard mask layer 17 may include a photoresist, silicon oxide, silicon nitride, or a combination thereof.

The active regions 13 and the isolation layer 16 may be etched by using the hard mask layer 17 to form the gate trench 18. When the active regions 13 include silicon and the isolation layer 16 includes silicon oxide and silicon nitride, an etching process for forming the gate trench 18 may include a silicon etching process. Portions of the isolation layer 16 may be etched while the active regions 13 are etched. For example, the upper surface of the isolation layer 16 before the formation of the gate trench 18 may have a first horizontal level HL1, and the upper surface of the isolation layer 16 after the formation of the gate trench 18 may be lowered to a second horizontal level HL2 and a third horizontal level HL3. The second horizontal level HL2 may be higher than the third horizontal level HL3, and the second horizontal level HL2 may be lower than the first horizontal level HL1.

While the active regions 13 are etched, the first isolation layer 14 and the second isolation layer 15 may be etched at different etch rates. For example, while the active regions 13 are etched, the first isolation layer 14 may be etched faster than the second isolation layer 15. Accordingly, the upper surface of the first isolation layer 14 of the first isolation portions 16A may be lowered to the third horizontal level HL3, and the upper surfaces of the first and second isolation layers 14 and 15 of the second isolation portions 16B may be lowered to the second horizontal level HL2. The lowermost bottom surface 18B of the gate trench 18 may be disposed at a fourth horizontal level HL4, and the fourth horizontal level HL4 may be lower than the third horizontal level HL3. The reason why the lowermost bottom surface 18B of the gate trench 18 is lower than the third horizontal level HL3 is that the etching rate of the active regions 13 is faster than those of the first isolation layer 14 and the second isolation layer 15.

As described above, the gate trench 18 may provide a bottom surface profile of a multi-layer horizontal level including the first to fourth horizontal levels HL1 to HL4. The bottom surface profile of the gate trench 18 may have a non-flat shape.

Figure 4G:
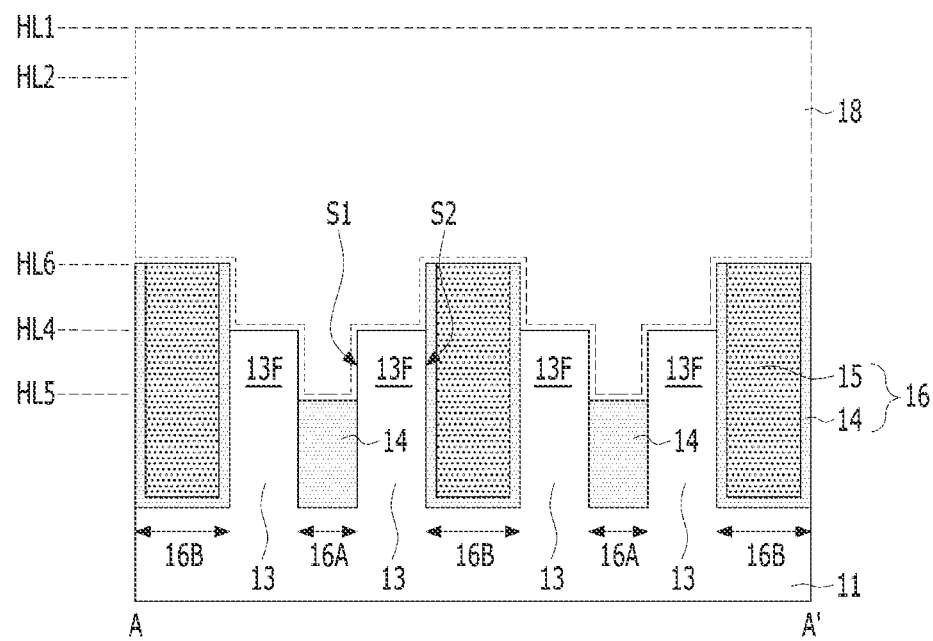
Figure 5G:
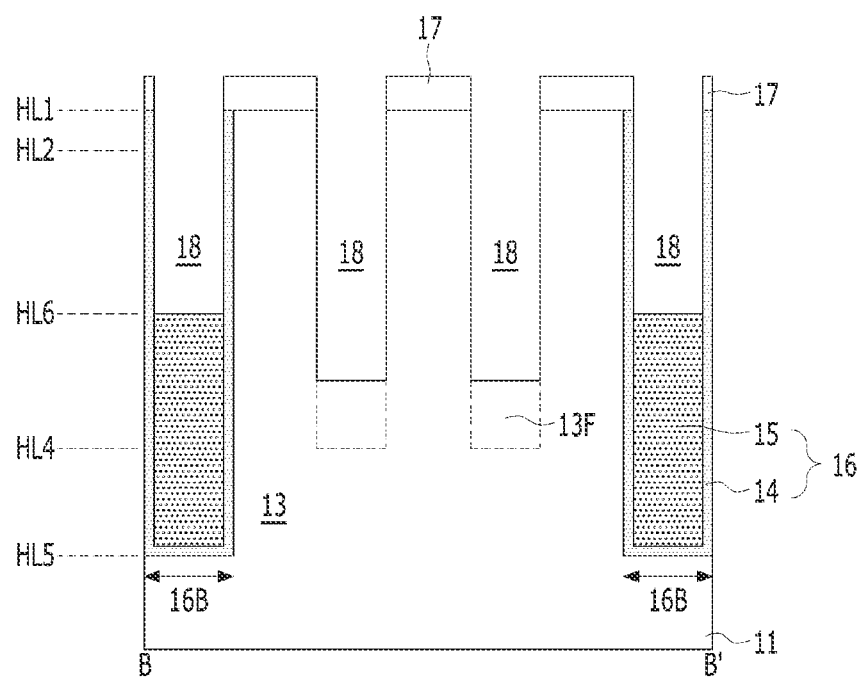

Referring to FIGS. 4G and 5G, in order to form the active fins 13F below the gate trench 18, the first isolation layer 14 and the second isolation layer 15 may be etched. By etching the first isolation layer 14 and the second isolation layer 15, the bottom surface of the gate trench 18 may be lowered. For example, as the first isolation layer 14 and the second isolation layer 15 are etched, the upper surfaces of the first isolation layers 14 of the first isolation portions 16A may be etched lower than the upper surface of the active fins 13F. Below the gate trench 18, the upper surface of the first isolation layer 14 of the first isolation portions 16A may be disposed at a fifth horizontal level HL5. The fifth horizontal level HL5 may be lower than the fourth horizontal level HL4.

While the first isolation layer 14 is etched, the first isolation layer 14 and the second isolation layer 15 may be etched at different etch rates. For example, while the first isolation layer 14 is etched to be disposed at the fifth horizontal level HL5, the second isolation layer may be lowered to a sixth horizontal level HL6. While the first isolation layer 14 is etched, the active fins 13F may be prevented from being etched. The sixth horizontal level HL6 may be higher than the fourth and fifth horizontal levels HL4 and HL5.

The active fins 13F may include first sidewalls S1 that are exposed by the first isolation portions 16A, and second sidewalls S2 that are covered by the second isolation portions 16B. The first sidewalls S1 may be referred to as exposed sidewalls, and the second sidewalls may be referred to as covered sidewalls.

The first sidewalls S1 and the second sidewalls S2 of the active fins 13F may have an asymmetrically exposed structure due to the isolation layer 16. The upper surfaces of the active fins 13F may be disposed at the fourth horizontal level L4. The upper surfaces of the active fins 13F may be disposed at a lower level than the upper surfaces of the first and second isolation layers 14 and 15 of the second isolation portions 16B, and the upper surfaces of the isolation layers 14 of the first isolation portions 16A may be disposed at a lower level than the upper surfaces of the second isolation layers 15 of the second isolation portions 16B.

As described above, by a series of the processes for forming the gate trench 18, the bottom surface profile of the gate trench 18 may have a non-flat shape. The active fin 13F may have an asymmetric sidewall structure between the first isolation portion 16A and the second isolation portion 16B.

Figure 4H:
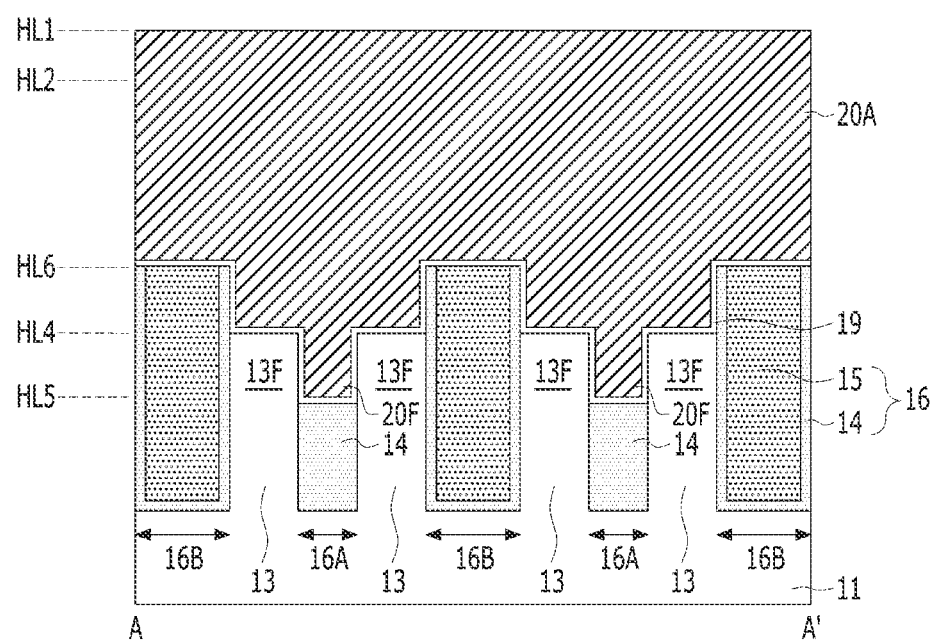
Figure 5H:
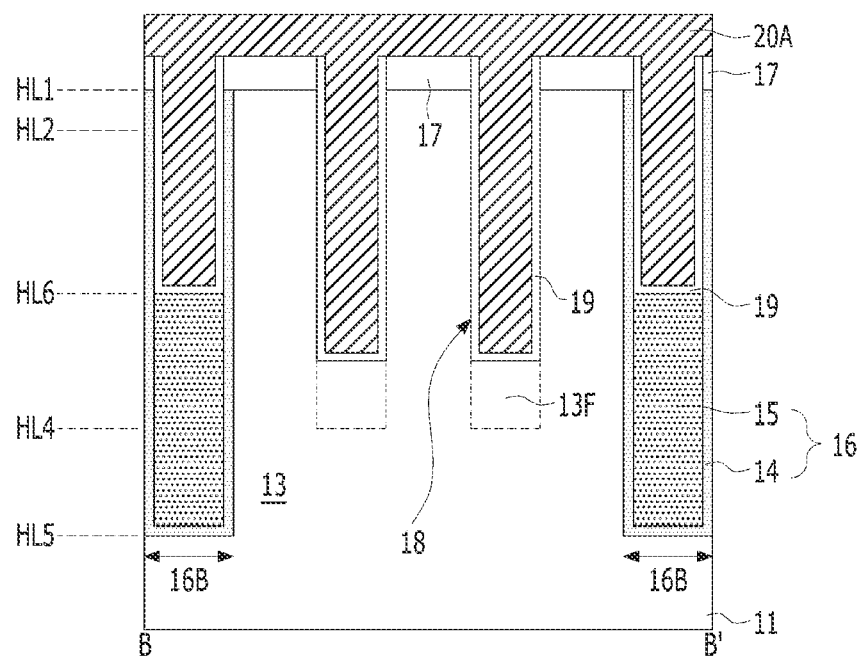

Referring to FIGS. 4H and 5H, a gate dielectric layer 19 may be formed over the active fins 13F. The gate dielectric layer 19 may be conformally formed on the bottom surface and sidewalls of the gate trench 18. The gate dielectric layer 19 may extend to be formed over the first isolation portions 16A and the second isolation portions 16B. The gate dielectric layer 19 may include silicon oxide, silicon nitride, silicon oxynitride, a high-k material, or a combination thereof. The high-k material may include a material having a greater dielectric constant than that of silicon oxide. For example, the high-k material may include a material having a dielectric constant greater than approximately 3.9. To take another example, the high-k material may include a material having a dielectric constant greater than approximately 10. To take yet another example, the high-k material may include a material having a dielectric constant of approximately to 30. The high-k material may include at least one metallic element. The high-k material may include a hafnium-containing material. The hafnium-containing material may include hafnium oxide, hafnium silicon oxide, hafnium silicon oxynitride, or a combination thereof. According to another embodiment of the present invention, the gate dielectric layer 19 may include lanthanum oxide, lanthanum aluminum oxide, zirconium oxide, zirconium silicon oxide, zirconium silicon oxynitride, aluminum oxide, or a combination thereof. As for the gate dielectric layer 19, other known high-k materials may be selectively used. The gate dielectric layer 19 may include a metal oxide.

A first gate layer 20A may be formed over the gate dielectric layer 19. The first gate layer 20A may include a low-resistance material. The first gate layer 20A may include a metal-based material. The first gate layer 20A may include a metal, a metal nitride, or a combination thereof. The first gate layer 20A may include tungsten, titanium nitride, tantalum nitride, titanium silicon nitride (TiSiN), silicon-doped titanium nitride (Si-doped TiN, TSN), or a combination thereof. According to some embodiments of the present invention, the first gate layer 20A may be formed of titanium nitride (TiN). The first gate layer 20A may include a work function adjusting element, and the work function adjusting element may include phosphorus or arsenic.

According to another embodiment of the present invention, the first gate layer 20A may be formed of a high work function material. The high work function material may be of a material having a work function value of approximately 4.5 eV or more.

The first gate layer 20A may include a gap-fill portion 20F' which is disposed between the neighboring active fins 13F. The gap-fill portion 20F of the first gate layer 20A may be disposed over the first isolation portion 16A.

Figure 4I:
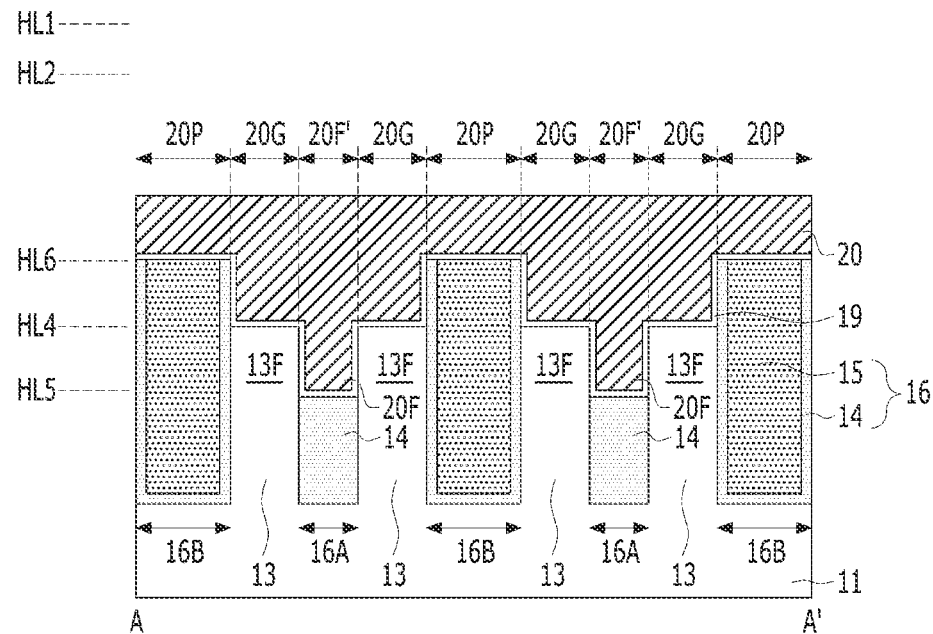
Figure 5I:
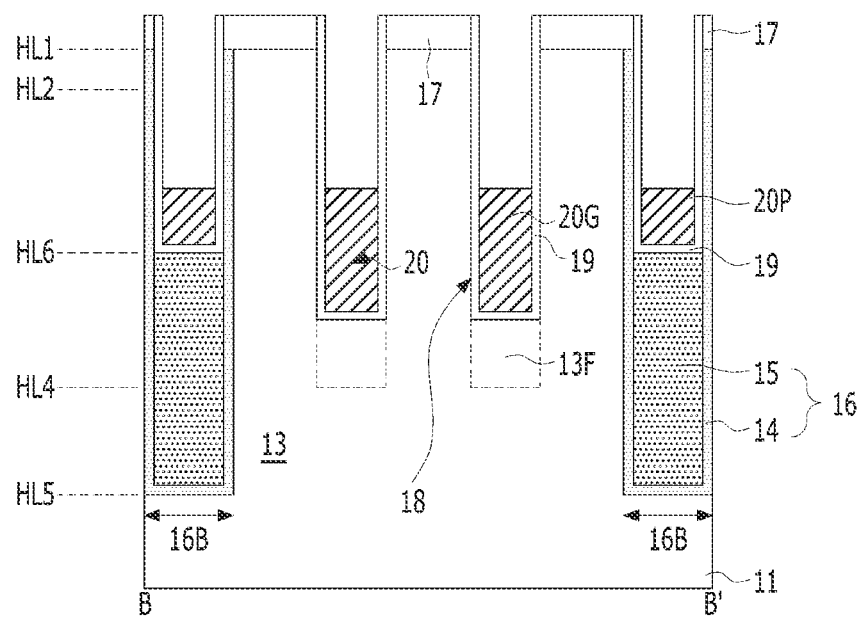

Referring to FIGS. 4I and 5I, the first gate layer 20A may be selectively etched to form the first gate electrode 20. The selective etching of the first gate layer 20A may include an etch-back process. The upper surface of the first gate electrode 20 may be lower than the first and second horizontal levels HL1 and HL2.

The first gate electrode 20 may cover the isolation layer 16 over the gate dielectric layer 19. The first gate electrode 20 may include active electrodes 20G, passing electrodes 20P, and fin electrodes 20F'. The passing electrodes 20P may be disposed over the second isolation portions 16B. The active electrodes 20G may be disposed over the active fins 13F. The fin electrodes 20F' may be disposed over the first isolation portions 16A. The fin electrodes 20F' may include a gap-fill portion 20F which is disposed between the neighboring active fins 13F. The gap-fill portion 20F of the fin electrodes 20F' may be disposed over the first isolation portion 16A.

The bottom surfaces of the active electrodes 20G may be disposed at a lower level than the bottom surfaces of the passing electrodes 20P. The bottom surfaces of the fin electrodes 20F' may be disposed at a lower level than the bottom surfaces of the active electrodes 20G. The height of the active electrodes 20G may be greater than the height of the passing electrodes 20P, and the height of the fin electrodes 20F may be greater than the height of the active electrodes 20G.

Figure 4J:
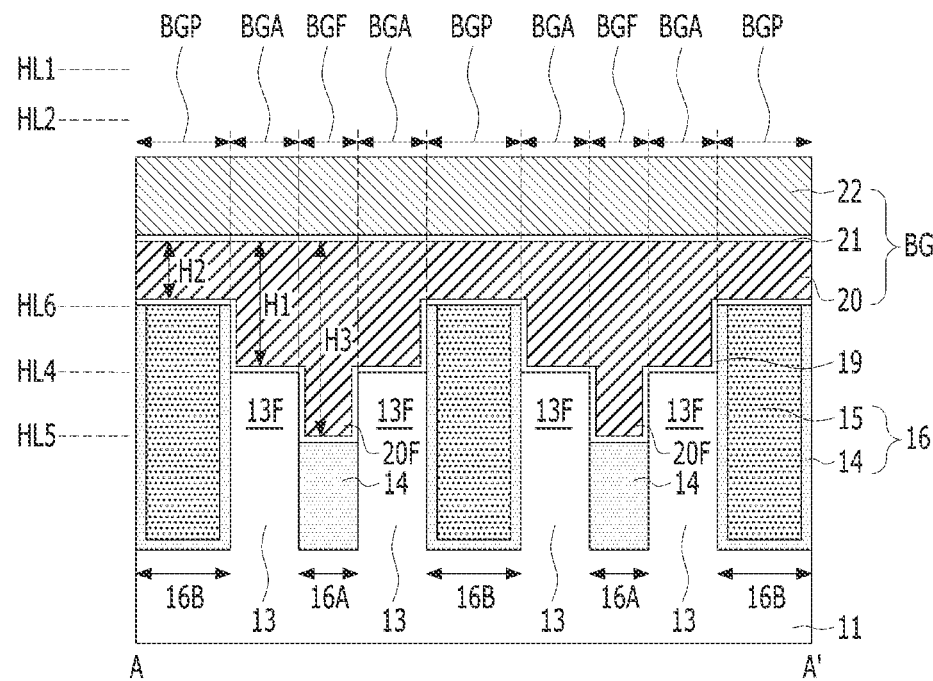
Figure 5J:
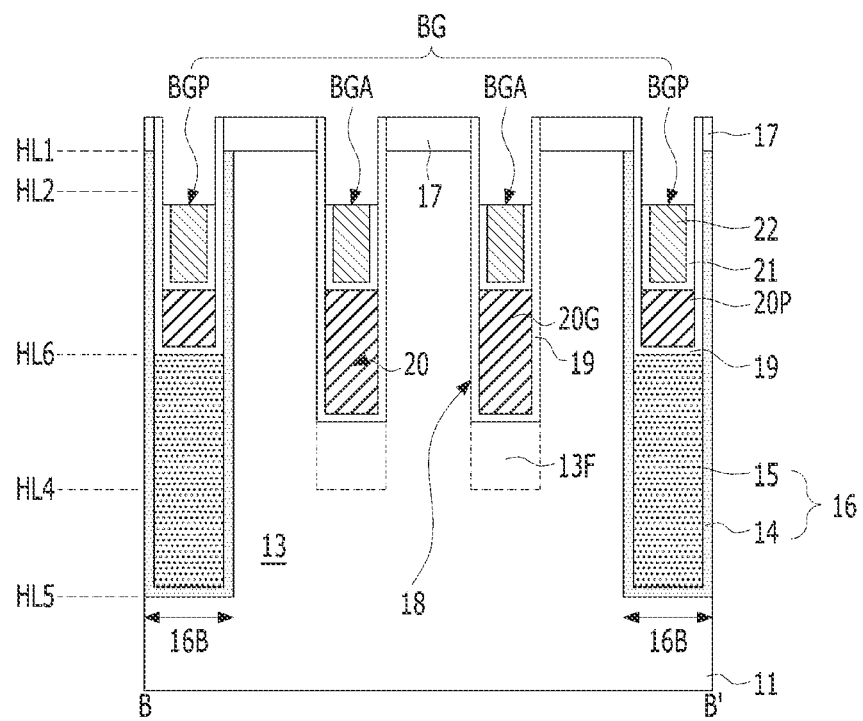

Referring to FIGS. 4J and 5J, a dipole inducing layer 21 may be formed over the first gate electrode 20, and a second gate electrode 22 may be formed over the dipole inducing layer 21. The method for forming the dipole inducing layer 21 and the second gate electrode 22 may include conformally forming a dipole inducing material layer, forming a low work function material layer over the dipole inducing material layer, performing an etch-back process on the low work function material layer to form the second gate electrode 22, and performing an etch-back process on the dipole inducing material layer to form the dipole inducing layer 21.

The dipole inducing layer 21 may include a material having a lower areal density of oxygen atoms than that of the gate dielectric layer 19. Due to the difference in the areal density of oxygen atoms, the dipole inducing layer 21 and the gate dielectric layer 19 may generate a dipole in a direction that the work function is decreased. The dipole may decrease an effective work function value of the second gate electrode 22. Accordingly, the dipole inducing layer 21 may be referred to as a 'low work function liner'. The areal density of oxygen atoms in the dipole inducing layer 21 may be lower than that of the gate dielectric layer 19. The difference in the areal density of oxygen atoms may allow the oxygen atoms of the gate dielectric layer 19 to diffuse into the dipole inducing layer 21. As the oxygen atoms diffuse, the gate dielectric layer 19 may be positively charged, and the dipole inducing layer 21 may be negatively charged. As such, dipoles may be induced at the interface between the positively charged gate dielectric layer 19 and the negatively charged dipole inducing layer 21. The induced dipoles may raise the energy band of the second gate electrodes 22, whereby the second gate electrodes 22 may have a decreased work function. After all, as the work function of the second gate electrodes 22 decreases, the gate-induced drain leakage (GIDL) may be suppressed. The gate dielectric layer 19 may include silicon oxide ($SiO_2$), and the dipole inducing layer 21 may be formed of a material having a lower areal density of oxygen atoms than silicon oxide. The dipole inducing layer 21 may include a metal atom. The dipole inducing layer 21 may include a metal oxide. The dipole inducing layer 21 may include a metal oxide monolayer. The dipole inducing layer 21 may include lanthanum atoms. The dipole inducing layer 21 may include lanthanum oxide or a lanthanum oxide monolayer. The lanthanum atom may be referred to as 'dipole inducing species'. For example, the ratio of the areal densities of oxygen atoms of lanthanum oxide to silicon oxide ($SiO_2$) may be approximately 0.77. According to another embodiment of the present invention, the dipole inducing layer 21 may include yttrium oxide ($Y_2O_3$), germanium oxide ($GeO_2$), lutetium oxide ($Lu_2O_3$), or strontium oxide (SrO).

The second gate electrode 22 may include a metal-based material having a low work function value. The second gate electrode 22 may include a metal, a metal nitride, or a combination thereof. The second gate electrode 22 may include tungsten, titanium nitride, tantalum nitride, titanium silicon nitride (TiSiN), silicon-doped titanium nitride (Si-doped TiN, TSN), or a combination thereof.

According to some embodiments of the present invention, the first gate electrodes 20 may be formed of titanium nitride (TiN), and the second gate electrodes 22 may be formed of silicon-doped titanium nitride (TSN). In order to maximize the low work function, the second gate electrodes 22 may further include a work function adjusting element. The work function adjusting element may include phosphorus (P) or arsenic (As). The first gate electrodes 20 may also include a work function adjusting element. The first gate electrodes and the second gate electrodes 22 may include the same work function adjusting element, and the concentration of the work function adjusting element may be higher in the second gate electrode 22 than in the first gate electrode 20. As for a method of doping the second gate electrodes 22 with the work function adjusting element, gas phase deposition, ion beam implantation, or plasma doping (PLAD) may be used. According to the gas phase deposition method, a source material containing a work function adjusting element may flow in situ when the low work function material layer is deposited as the second gate electrode 22. According to the ion beam implantation method and plasma doping method the work function adjusting element may be doped after the low work function material layer is deposited.

In order to maximize the low work function, the volume of the second gate electrodes 22 may be increased more than the volume of the first gate electrodes 20.

According to another embodiment of the present invention, the first gate electrodes 20 may be formed of a high work function material, and the second gate electrodes 22 may be formed of a low work function material. The high work function material may be a material having a work function value of approximately 4.5 eV or more, and the low work function material may be a material having a lower work function value than approximately 4.5 eV.

A buried gate BG may be formed by a series of the processes described above, and the buried gate BG may include the first gate electrode 20, the dipole inducing layer 21, and the second gate electrode 22.

The buried gate BG may include a plurality of active gates BGA, a plurality of passing gates BGP, and a plurality of fin gates BGF in a direction that the gate trench 18 extends. Each of the active gates BGA, the passing gates BGP, and each of the fin gates BGF may be stacked in the order of the first gate electrode 20, the dipole inducing layer 21, and the second gate electrode 22.

The first gate electrodes 20 of the active gates BGA may have a first height H1, and the first gate electrodes 20 of the passing gates BGP may have a second height H2. The first gate electrodes 20 of the fin gates BGF may have a third height H3, The first height H1 may be greater than the second height H2, and the third height H3 may be greater than the first height H1.

Figure 4K:
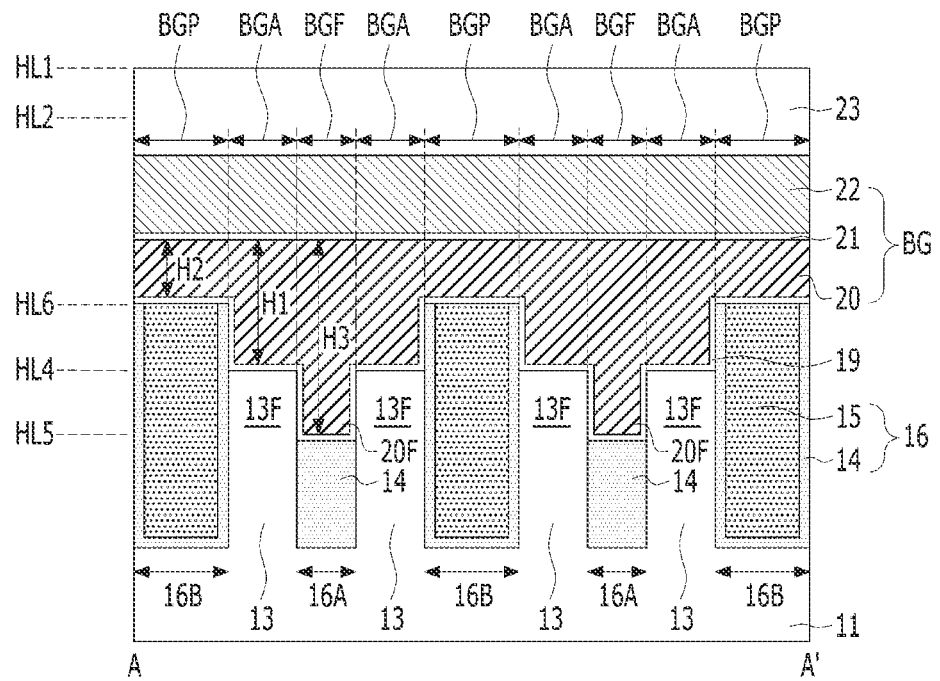
Figure 5K:
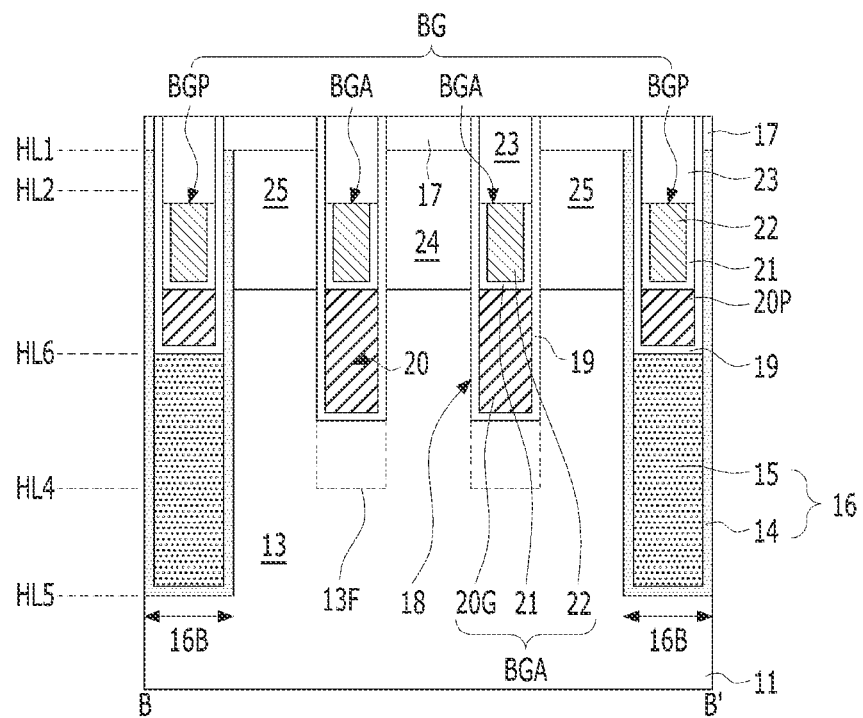

Referring to FIGS. 4K and 5K, a capping layer 23 may be formed over the second gate electrode 22 for protecting the second gate electrode 22. The capping layer 23 may include a dielectric material including, for example, silicon nitride, silicon oxynitride, or a combination thereof. According to another embodiment of the present invention, the capping layer 23 may include a combination of silicon nitride and silicon oxide. The capping layer 23 may include a stack of a silicon nitride liner and a spin-on dielectric material (SOD).

Subsequently, the first and second doped regions 24 and 25 may be formed on both sides of the active gates BGA. The first and second doped regions 24 and 25 may be formed in the active region 13. The first and second doped regions 24 and 25 may be regions doped with a conductive dopant. For example, the conductive dopant may include phosphorus (P), arsenic (As), antimony (Sb), or boron (B), The first and second doped regions 24 and 25 may be doped with dopants of the same conductivity type. The first and second doped regions 24 and 25 may be referred to as first and second source/drain regions, respectively.

Figure 6:
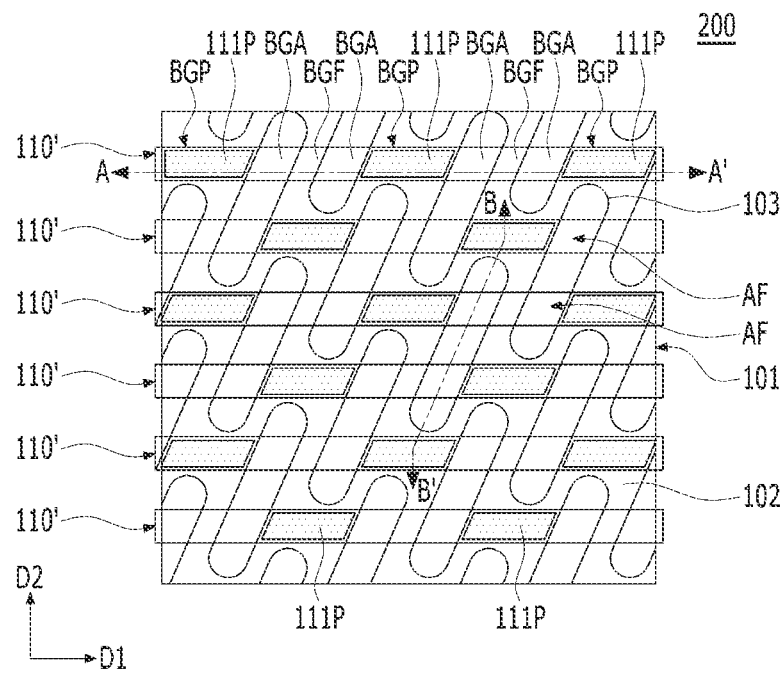
FIG. 6 is a plan view schematic illustrating the constituent elements of a semiconductor device in accordance with another embodiment of the present invention.
Figure 7:
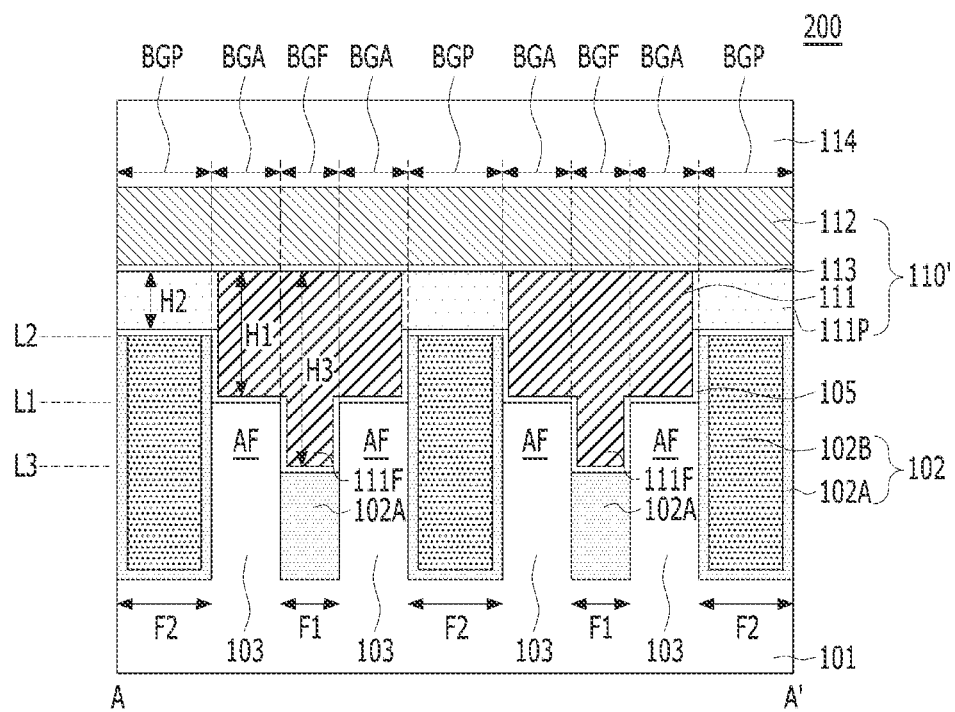
FIG. 7 is a cross-sectional view schematic of the constituent elements taken along a line A-A' shown in FIG. 6.
Figure 8:
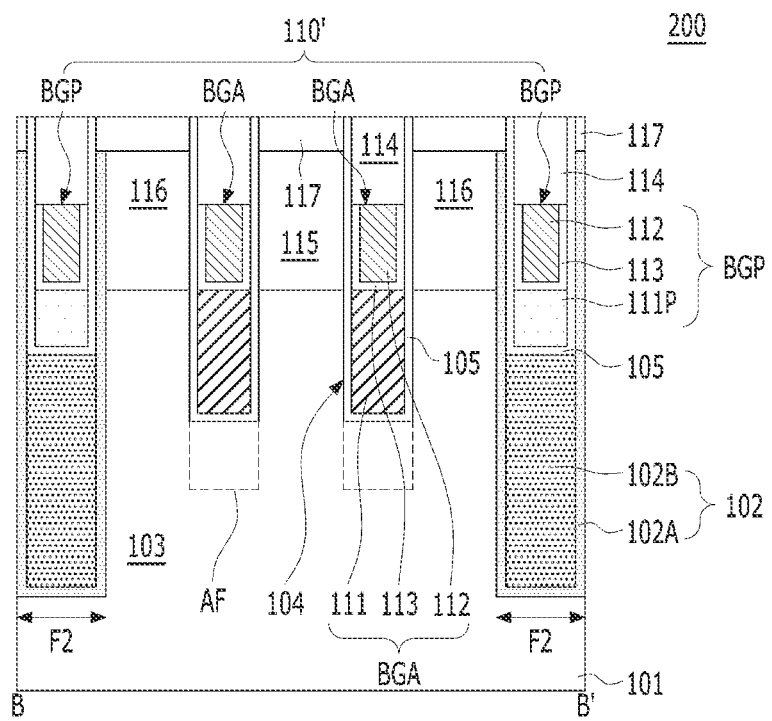
FIG. 8 is a cross-sectional view schematic of the constituent elements taken along a line B-B' shown in FIG. 6.

FIG. 6 is a plan view schematic main constituent elements of a semiconductor device 200 in accordance with another embodiment of the present invention. FIG. 7 is a cross-sectional view schematic of the constituent elements taken along a line A-A' shown in FIG. 6. FIG. 8 is a cross-sectional view schematic of the constituent elements taken along a line B-B' shown in FIG. 6. The semiconductor device 200 may be similar to the semiconductor device 100 of FIGS. 1 to 3. Herein, as for the detailed descriptions on the constituent elements also appearing in FIGS. 1 to 3, descriptions of FIGS. 1 to 3 may be referred to.

Referring to FIGS. 6 to 8, the semiconductor device 200 may include a substrate 101, an isolation layer 102, a plurality of active regions 103, and a plurality of buried gates 110'.

The buried gates 110' may be formed in gate trenches 104 and may extend across a plurality of active regions 103 and isolation layer 102 simultaneously. The buried gates 110' may extend in the first direction D1, and the buried gates 110' that are adjacent to each other in the second direction D2 may be disposed at regular intervals from each other.

The buried gates 110' may include active gates BGA, passing gates BGP, and fin gates BGF. The active gates BGA may traverse the active regions 103, and the passing gates BGP and the fin gates BGF may traverse the isolation layer 102.

The active gates BGA may be disposed between the passing gates BGP and the fin gates BGF. The passing gates BGP, the active gates BGA, the fin gates BGF, and the active gates BGA may be horizontally repeated in the first direction D1. The isolation layer 102 may be disposed below the passing gates BGP and the fin gates BGF. Active fins AF may be disposed below the active gates BGA, and gate dielectric layers 105 may be disposed between the active fins AF and the active gates BGA. The gate dielectric layers 105 may be disposed between the passing gates BGP and the isolation layer 102. The gate dielectric layers 105 may be disposed between the fin gates BGF and the isolation layer 102. The fin gates BGF may include a gap-fill portion 111F which is disposed between the neighboring active fins AF The gap-fill portion 111F may horizontally overlap with some sidewalls of the active fins AF.

The bottom surfaces L1 of the active gates BGA may be disposed at a lower level than the bottom surfaces L2 of the passing gates BGP. The bottom surfaces L3 of the fin gates BGF may be disposed at a lower level than the bottom surfaces L1 of the active gates BGA. The bottom surfaces L3 of the fin gates BGF may be disposed at a lower level than the bottom surfaces L2 of the passing gates BGP.

Each of the buried gates 110' may include a first gate electrode 111, a second gate electrode 112, a dummy electrode 111P, and a dipole inducing layer 113. Each of the active gates BGA and the fin gates BGF may include a first gate electrode 111, a second gate electrode 112, and a dipole inducing layer 113 between the first and second gate electrodes 111 and 112. Each of the passing gates BGP may include a dummy electrode 111P, a second gate electrode 112, and a dipole inducing layer 113 between the dummy electrode 111P and the second gate electrode 112.

The first gate electrodes 111 of the fin gates BGF may extend from the first gate electrodes 111 of the active gates BGA. The first gate electrodes 111 of the fin gates BGF and the active gates BGA may be formed of the same material and may have an integrated structure.

The second gate electrodes 112 of the passing gates BGP and the fin gates BGF may extend from the second gate electrodes 112 of the active gates BGA. The second gate electrodes 112 of the passing gates BGP, the fin gates BGF, and the active gates BGA may be formed of the same material and may have an integrated structure.

The dipole inducing layers 113 of the passing gates BGP and the fin gates BGF may extend from the dipole inducing layers 113 of the active gates BGA. The dipole inducing layers 113 of the passing gates BGP, the fin gates BGF, and the active gates BGA may be formed of the same material and may have an integrated structure.

The first gate electrodes 111 of the active gates BGA may have a first height H1, and the dummy electrodes 111P of the passing gates BGP may have a second height H2. The first gate electrodes 111 of the fin gates BGF may have a third height H3. The first height H1 may be greater than the second height H2, and the third height H3 may be greater than the first height H1.

The dummy electrodes 111P of the passing gates BGP may include a dielectric material. The dummy electrodes 111P may include silicon oxide, silicon nitride, or a combination thereof. The dummy electrodes 111P and the first gate electrodes 111 may be coupled to each other. The dummy electrodes 111P of the passing gates BGP may be formed as a portion of the first gate electrodes 111 is replaced with a dielectric material, which will be described later.

Since the passing gates BGP include the dielectric dummy electrodes 111P, that is, since the conductive first gate electrodes are removed, the concentration of trapped electrons may be reduced, thereby suppressing the row hammer.

The isolation layer 102 may include silicon oxide, silicon nitride, or a combination thereof. The isolation layer 102 may include a first isolation layer 102A and a second isolation layer 102B. The first isolation layer 102A and the second isolation layer 102B may be formed of different materials. Each of the first isolation layer 102A and the second isolation layer 102B may include silicon oxide, silicon nitride, or a combination thereof. For example, the first isolation layer 102A may be of silicon oxide, and the second isolation layer 102B may be of silicon nitride.

The isolation layer 102 may include a plurality of first isolation portions F1 and a plurality of second isolation portions F2. The first isolation portions F1 and the second isolation portions F2 may be alternately repeated in the first direction D1. The first isolation portions F1 may be disposed below the fin gates BGF of the buried gates 110', and the second isolation portions F2 may be disposed below the passing gates BGP of the buried gates 110' The first isolation portions F1 may have a single layer structure of the first isolation layer 102A, and the second isolation portions F2 may have a double layer structure of the first isolation layer 102A and the second isolation layer 102B.

A single-layer structure of the first isolation layer 102A may be disposed below the fin gates BGF of each buried gate 110', and a double-layer structure of the first isolation layer 102A and the second isolation layer 102B may be disposed below the passing gates BGP of the buried gates 110'.

The active fins AF may provide an asymmetric channel (see CH of FIG. 2B) between the first isolation portions F1 and the second isolation portions F2. The upper surfaces of the active fins AF may be disposed at a lower level than the upper surfaces of the second isolation portions F2, and the upper surfaces of the active fins AF may be disposed at a higher level than the upper surfaces of the first isolation portions F1.

As described above, the bottom surface profile of the gate trench 104 may have a non-flat shape. The non-flat shape may include a stepped profile.

Referring to FIGS. 7 and 8, the bottom surfaces L3 of the fin gates BGF may be disposed at a lower level than the bottom surfaces L2 of the passing gates BGP. Also, the bottom surfaces L3 of the fin gates BGF may be disposed at a level lower than the bottom surfaces L1 of the active gate BGA. The bottom surfaces L1 of the active gates BGA may be disposed at a lower level than the bottom surfaces L2 of the passing gates BGP. The fin gates BGF and active gates BGA may define an asymmetric channel in the active fins AF. Since the passing gates BGP include the dielectric dummy electrodes 111P, they may not substantially affect the formation of the channel.

Figure 9A:
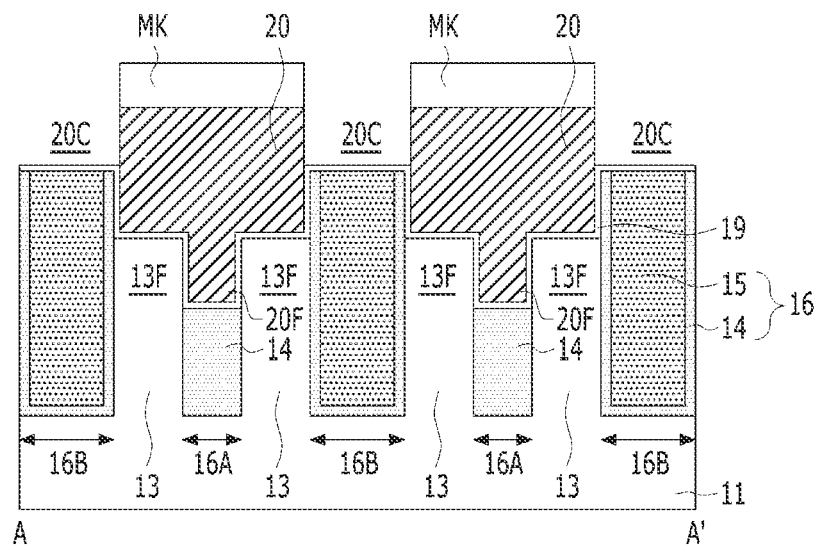
FIGS. 9A to 9C are cross-sectional view schematics taken along the line A-A' illustrating an example of a method for fabricating the semiconductor device shown in FIG. 6.
Figure 9B:
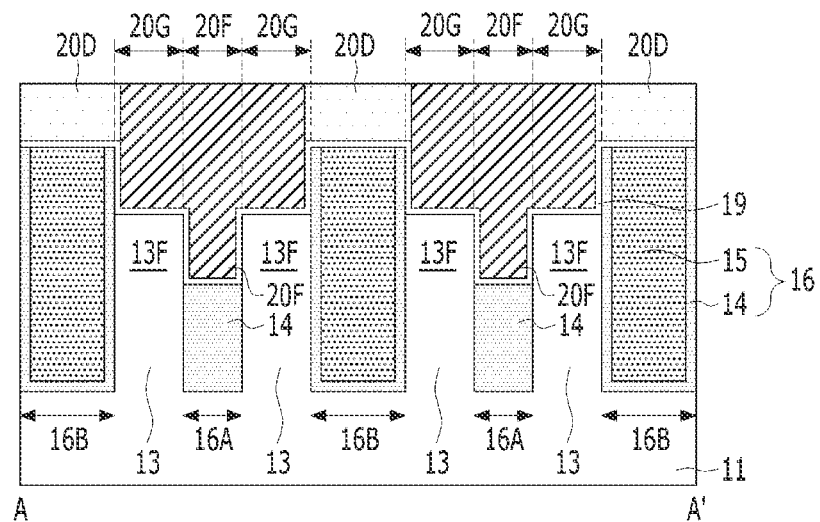
Figure 9C:
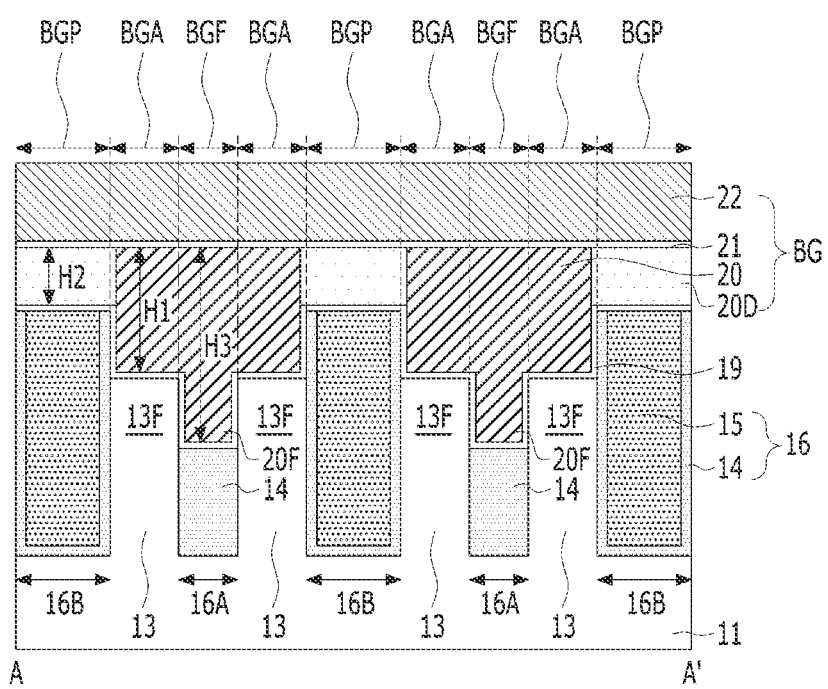
Figure 10A:
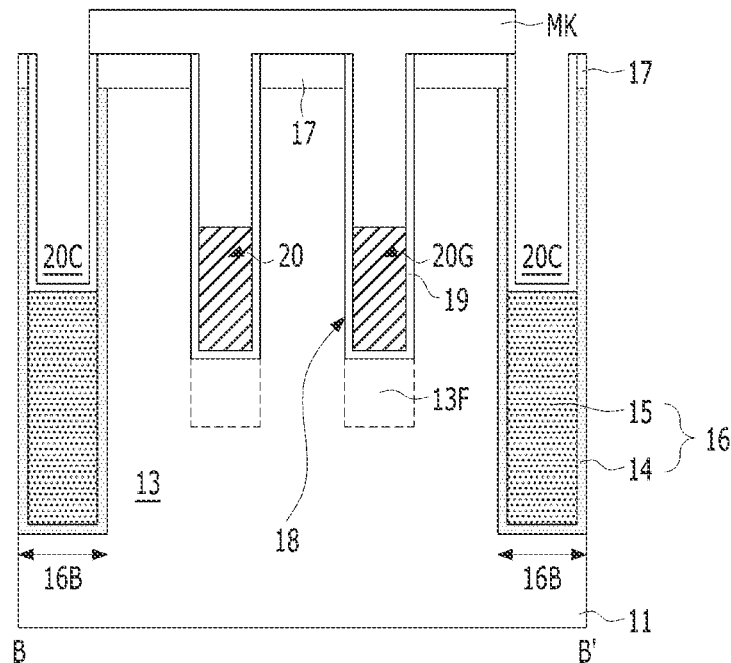
FIGS. 10A to 10C are cross-sectional view schematics taken along the line B-B' illustrating an example of a method for fabricating the semiconductor device shown in FIG. 6.
Figure 10B:
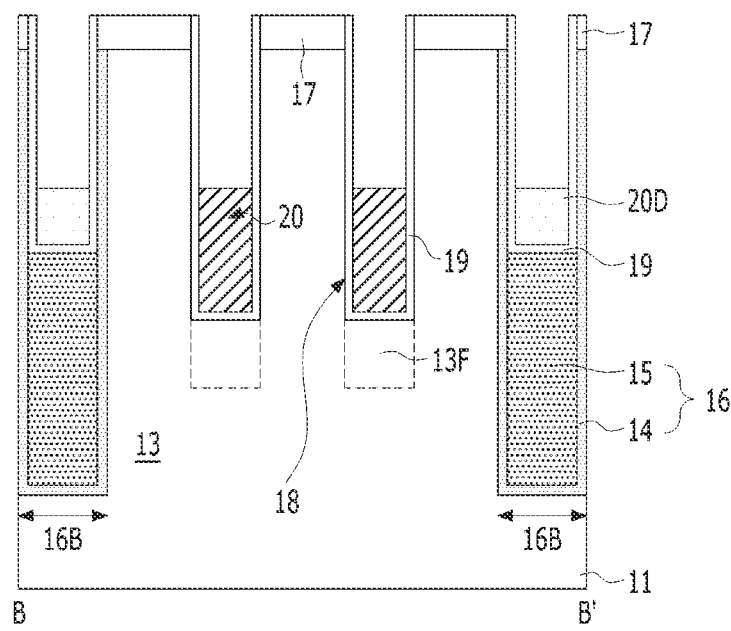
Figure 10C:
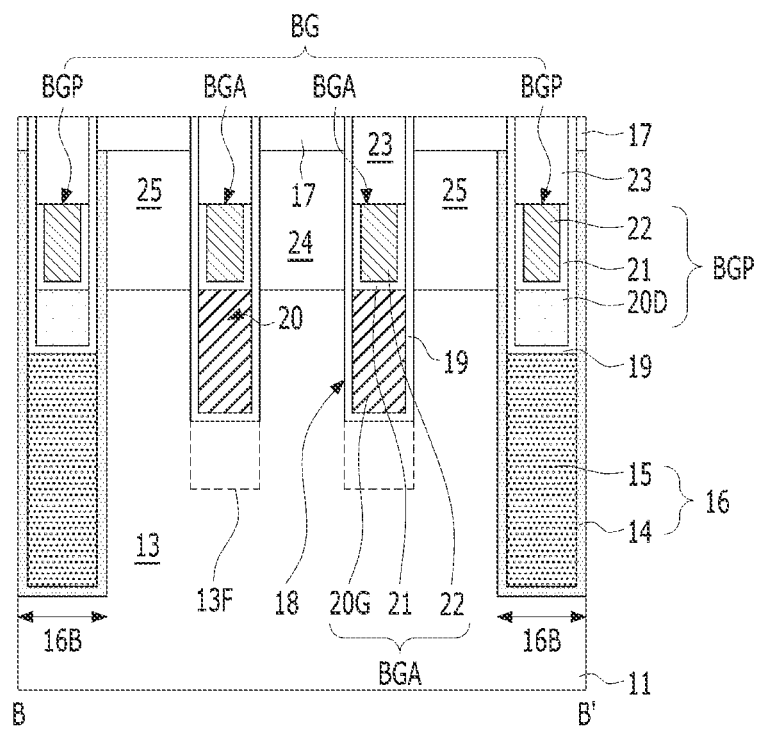

FIGS. 9A to 10C are cross-sectional view schematics illustrating an example of a method for fabricating a semiconductor device in accordance with another embodiment of the present invention. FIGS. 9A to 9C are cross-sectional view schematics taken along the line A-A' illustrating an example of a method for fabricating the semiconductor device shown in FIG. 6. FIGS. 10A to 10C are cross-sectional view schematics taken along the line B-B' illustrating an example of a method for fabricating the semiconductor device shown in FIG. 6.

First, first gate electrodes 20 may be formed by performing a series of the processes illustrated in FIGS. 4A to 4I and 5A to 5I.

Subsequently, as illustrated in FIGS. 9A and 10A, portions of the first gate electrodes 20 may be selectively removed in order to form a plurality of cutting portions 20C. For example, portions of the first gate electrodes 20 may be etched by using a mask layer MK. The cut portions 20C may be disposed over the second isolation portions 16B.

Referring to FIGS. 9B and 1B, dummy electrodes 20D filling the cut portions 20C may be formed. The dummy electrodes 20D may be formed by depositing and etching a dielectric material. The dummy electrodes 20D may include silicon oxide, silicon nitride, or a combination thereof. The dummy electrodes 20D may be electrically insulating.

The upper surfaces of active electrodes 20G, fin electrodes 20F, and dummy electrodes 20D may be disposed at the same level, and the heights of the active electrodes 20G and the fin electrodes 20F may be greater than the height of the dummy electrodes 20D.

Referring to FIGS. 9C and 10C, a dipole inducing layer 21 may be formed over the first gate electrodes 20, and second gate electrodes 22 may be formed over the dipole inducing layer 21. The method of forming the dipole inducing layer 21 and the second gate electrodes 22 may include conformally forming a dipole inducing material layer, forming a low work function material layer over the dipole inducing material layer, performing an etch-back process on the low work function material layer to form the second gate electrodes 22, and performing an etch-back process on the dipole inducing material layer to form the dipole inducing layer 21.

Through a series of the processes described above, buried gates BG may be formed, and each of the buried gates BG may include the first gate electrode 20, the dummy electrode 20D, the dipole inducing layer 21, and the second gate electrode 22.

The buried gates BG may include a plurality of active gates BGA, a plurality of passing gates BGP, and a plurality of fin gates BGF. Each of the active gates BGA and the fin gates BGF may include the first gate electrode 20, the dipole inducing layer 21, and the second gate electrode 22 that are stacked in the mentioned order. The passing gates BGP may include the dummy electrode 20D, the dipole inducing layer 21, and the second gate electrode 22 that are stacked in the mentioned order.

The first gate electrodes 20 of the active gates BGA may have a first height H1, and the dummy electrodes 20D of the passing gates BGP may have a second height H2. The first gate electrodes 20 of the fin gates BGF may have a third height H3. The first height H1 may be greater than the second height H2, and the third height H3 may be greater than the first height H1.

Figure 11:
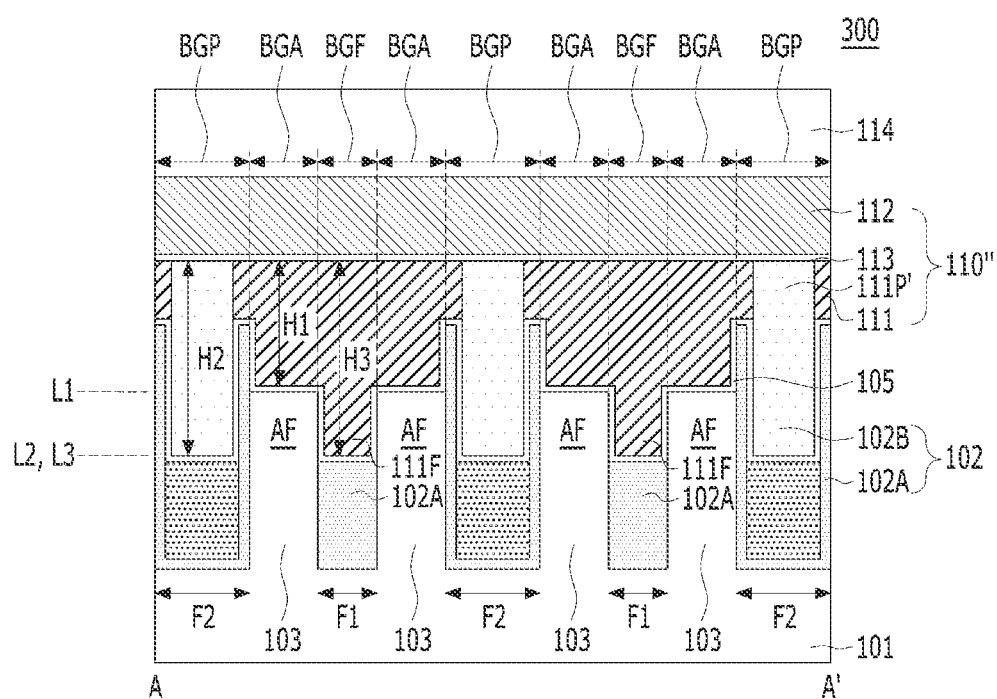
FIG. 11 is a cross-sectional view schematic illustrating a modification example of FIG. 7 taken along the line A-A' shown in FIG. 6.
Figure 12:
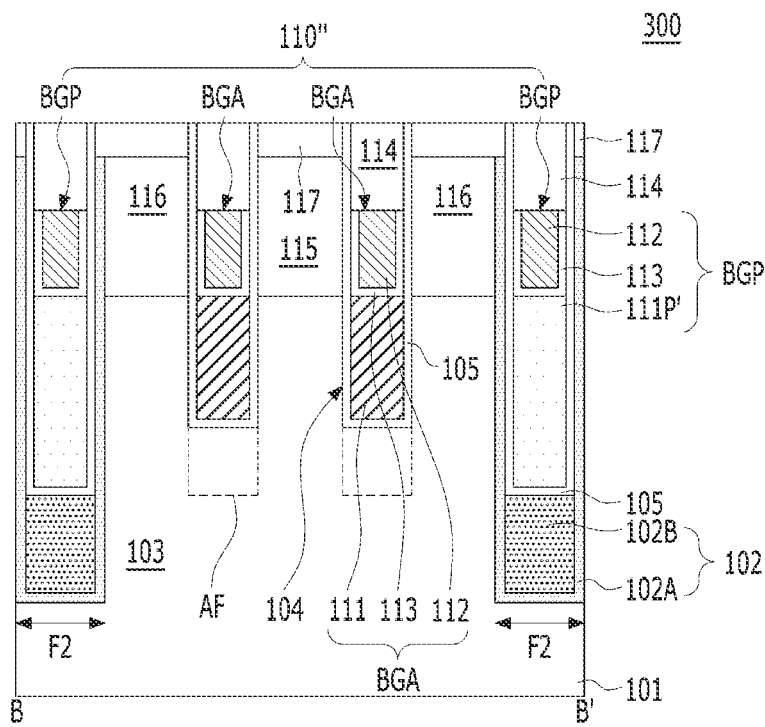
FIG. 12 is a cross-sectional view schematic illustrating a modification example of FIG. 8 taken along the line B-B' shown in FIG. 6.

Subsequently, as illustrated in FIGS. 4K and 5K, a capping layer 23 may be formed over the second gate electrodes 22. Subsequently, first and second doped regions 24 and 25 may be formed on both sides of the active gates BGA, FIG. 11 is a cross-sectional view schematic illustrating a modification example of FIG. 7 taken along the line A-A' shown in FIG. 6. FIG. 12 is a cross-sectional view schematic illustrating a modification example of FIG. 8 taken along the line B-B' shown in FIG. 6. The semiconductor device 300 may be similar to the semiconductor device 100 of FIGS. 1 to 3. Also, the semiconductor device 300 may be similar to the semiconductor device 200 of FIGS. 7 and 8. Hereinafter, as for the detailed descriptions on the constituent elements also appearing in FIGS. 1 to 3, descriptions of FIGS. 1 to 3 may be referred to.

Referring to FIGS. 11 and 12, the semiconductor device 300 may include a substrate 101, an isolation layer 102, a plurality of active regions 103, and a plurality of buried gates 110".

The buried gates 110" may include active gates BGA, fin gates BGF, and passing gates BGP. The active gates BGA may traverse the active regions 103, and the passing gates BGP and the fin gates BGF may traverse the isolation layer 102.

Each of the buried gates 110" may include a first gate electrode 111, a dummy electrode 111P', a second gate electrode 112, and a dipole inducing layer 113. Each of the active gates BGA and the fin gates BGF may include a first gate electrode 111, a second gate electrode 112, and a dipole inducing layer 113 between the first and second gate electrodes 111 and 112. Each of the passing gates BGP may include a dummy electrode 111P', a dipole inducing layer 113, and a second gate electrode 112. The passing gates BGP may further include first gate electrodes 111, and the dummy electrodes 111P' may penetrate the first gate electrodes 111.

The bottom surfaces L1 of the active gates BGA may be disposed at a higher level than the bottom surfaces L2 of the passing gates BGP. The bottom surfaces L3 of the fin gates BGF may be disposed at a lower level than the bottom surfaces L1 of the active gates BGA. The bottom surfaces L2 of the dummy electrodes 111P' and the bottom surfaces L3 of the fin gates BGF may be disposed at the same level. The bottom surfaces L2 of the dummy electrodes 111P' may be disposed at a level lower than the upper surfaces of the second isolation portions F2.

The dummy electrodes 111P' of the passing gates BGP may include a dielectric material. The dummy electrodes 111P' may include silicon oxide, silicon nitride, or a combination thereof. The dummy electrodes 111P' and the first gate electrodes 111 may be coupled to each other. The dummy electrodes 111P' of the second passing gates BGP may be formed by replacing a portion of the first gate electrodes 111 with a dielectric material. For example, a method of replacing a portion of the first gate electrodes 111 with the dummy electrodes 111P' may include forming gate trenches 104 and active fins AF by etching a portion of the first isolation portions F1 and a portion of the second isolation portions F2, recessing a portion of the second isolation portions F2 below the gate trenches 104, forming a gate dielectric layer 105 over the gate trenches 104, forming the first gate electrodes 111 filling the gate trenches 104, forming dummy openings by removing portions of the first gate electrodes 111 that are disposed in the recessed portions of the second isolation portions F, and filling the dummy openings with a dielectric material so as to form dummy electrodes 111P'.

Since the passing gates BGP include the dielectric dummy electrodes 111P', that is, since the conductive first gate electrodes 111 are removed, the concentration of trapped electrons may be reduced, thereby suppressing the row hammer.

The semiconductor devices 100, 200, and 300 according to the above-described embodiments of the present invention include the dipole inducing layer 113 between the first gate electrodes 111 and the second gate electrodes 112. However, the dipole inducing layer 113 may be omitted according to another embodiment of the present invention.

Figure 13A:
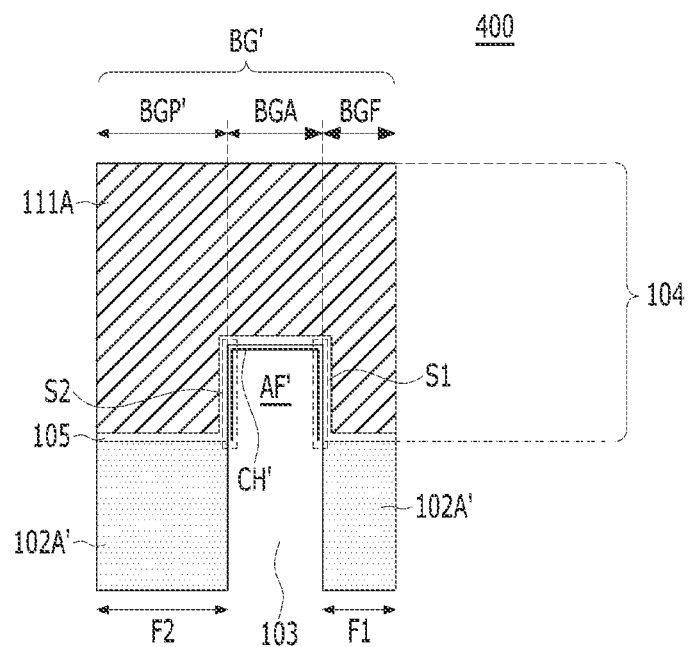
FIGS. 13A and 13B illustrate semiconductor devices according to comparative examples.
Figure 13B:
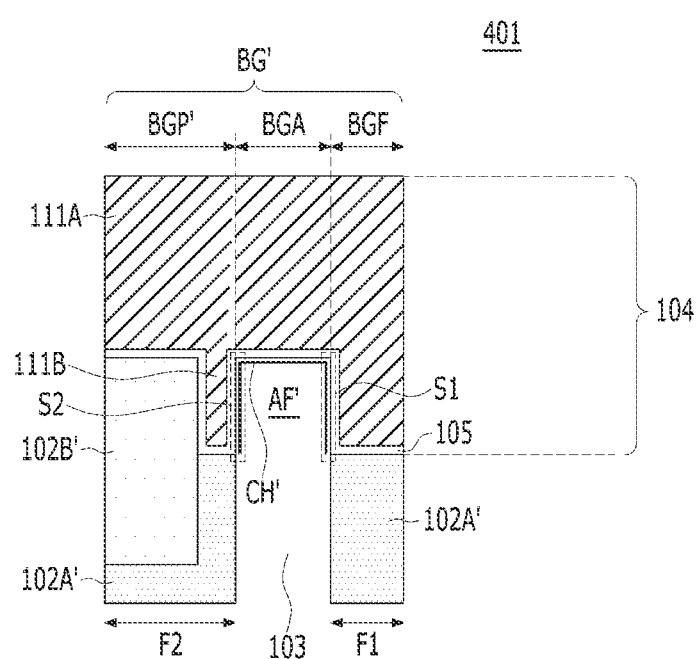

FIGS. 13A and 13B illustrate semiconductor devices according to comparative examples.

Referring to FIGS. 13A and 13B, the semiconductor devices 400 and 401 according to comparative examples may include buried gates BG' filling the gate trenches 104, and first isolation portions F1, second isolation portions F2, and active fins AF' may be disposed below the buried gates BG'. The first isolation portions F1 of FIGS. 13A and 13B may have a single-layer structure of silicon oxide 102A'. The second isolation portion F2 of FIG. 13A may have a single-layer structure of silicon oxide 102A'. The second isolation portions F2 of FIG. 13B may have a double-layer structure of silicon oxide 102A' and silicon nitride 102B'.

The first isolation portions F1 and the second isolation portions F2 may be recessed to be lower than the upper surfaces of the active fins AF'. Each of the active fins AF' may include a first sidewall S1 and a second sidewall S2. Each of the buried gates BG' may include an active gate BGA, a fin gate BGF and a passing gate BGP', and each of the active gates BGA, the fin gates BGF and the passing gates BGP' may include a first gate electrode 111A. Each of the passing gates BGP' of FIG. 13B may further include a gap-fill portion 111B.

The active gates BGA may vertically overlap with the upper surfaces of the active fins AF', and the fin gates BGF and the passing gates BGP' may horizontally overlap with the first sidewalls S1 and the second sidewalls S2 of the active fins AF'. Since the fin gates BGF and passing gates BGP' are disposed on the first sidewalls S1 and the second sidewalls S2 of the active fins AF', the active fins AF' may be positive active fins.

A symmetric channel CH' may be defined in the active fins AF' by the fin gates BGF and the passing gates BGP'.

Since the symmetrical channel CH' is defined in the comparative examples, the row hammer may be deteriorated.

According to some embodiments of the present invention, a semiconductor device with improved reliability may be fabricated.

According to some embodiments of the present invention, it is possible to prevent the row hammering effect by forming a pass gate of a buried gate to be sufficiently spaced apart from an active fin.

While the present invention has been described with respect to the specific embodiments, it will be apparent to those skilled in the art that various changes and modifications may be made without departing from the spirit and scope of the invention as defined in the following claims.

What is claimed is:

1. A semiconductor device, comprising:
an isolation layer formed to define active regions including active fins in a substrate;
gate trenches extending across the active fins and the isolation layer; and
buried gates that fill the gate trenches, and include
fin gates disposed on sidewalls of the active fins,
active gates disposed over the active fins, and
passing gates disposed over the isolation layer,
wherein bottom surfaces of the passing gates are disposed at a higher level than bottom surfaces of the active gates, and
bottom surfaces of the fin gates are disposed at a lower level than the bottom surfaces of the active gates.

2. The semiconductor device of claim 1, wherein each of the active fins includes an upper surface, and a first sidewall and a second sidewall that are horizontally facing each other with the upper surface interposed therebetween, the first sidewall and the fin gates horizontally overlap with each other, and the upper surface and the active gates vertically overlap with each other.

3. The semiconductor device of claim 1, wherein upper surfaces of the fin gates, the active gates, and the passing gates are disposed at the same level, the fin gates have a greater height than the active gates, and the passing gates have a smaller height than the active gates.

4. The semiconductor device of claim 1, wherein the isolation layer includes:

first isolation portions below the fin gates;

second isolation portions below the passing gates, and the active fins are disposed between the first isolation portions and the second isolation portions.

5. The semiconductor device of claim 4, wherein the upper surfaces of the active fins are disposed at a higher level than upper surfaces of the first isolation portions, and upper surfaces of the second isolation portions are disposed at a higher level than the upper surfaces of the active fins.

6. The semiconductor device of claim 4, wherein the first isolation portions include a single-layer structure of silicon oxide, and the second isolation portions include a double layer structure of silicon oxide and silicon nitride.

7. The semiconductor device of claim 1, wherein each of the active gates, the fin gates, and the passing gates includes:

a first gate electrode;

a second gate electrode; and a dipole inducing layer between the first gate electrode and the second gate electrode.

8. The semiconductor device of claim 7, wherein the second gate electrode includes a material having a higher work function than a work function of the first gate electrode.

9. The semiconductor device of claim 7, wherein the first gate electrode includes titanium nitride, and the second gate electrode includes titanium silicon nitride.

10. The semiconductor device of claim 7, wherein the first gate electrode includes titanium nitride, and the second gate electrode includes titanium silicon nitride which is doped with a work function adjusting element, and the work function adjusting element includes phosphorus or arsenic.

11. The semiconductor device of claim 7, wherein the dipole inducing layer includes a lanthanum-containing material.

12. The semiconductor device of claim 1, wherein the fin gates, the active gates, and the passing gates includes the same conductive material.

13. The semiconductor device of claim 1, wherein the fin gates and the active gates include a conductive material, and the passing gates include a dielectric material.

14. The semiconductor device of claim 1, wherein the fin gates and the active gates include a conductive low-resistance electrode, a conductive low-work function electrode, and a dipole inducing layer between the conductive low-resistance electrode and the conductive low-work function electrode, and the passing gates include a dielectric dummy electrode, a conductive low-work function electrode, and a dipole inducing layer between the dielectric dummy electrode and the conductive low-work function electrode.

15. A semiconductor device, comprising:

an isolation layer formed to define active regions including active fins in a substrate;

gate trenches extending across the active fins and the isolation layer; and buried gates that fill the gate trenches, and include fin gates disposed on sidewalls of the active fins, active gates disposed over the active fins, and passing gates disposed over the isolation layer, wherein the passing gates include dielectric dummy electrodes whose bottom surfaces are disposed at a lower level than bottom surfaces of the active gates, bottom surfaces of the fin gates are disposed at a lower level than the bottom surfaces of the active gates, and the bottom surfaces of the dielectric dummy electrodes and the bottom surfaces of the fin gates are disposed at the same level.

16. The semiconductor device of claim 15, wherein each of the active fins includes an upper surface, and a first sidewall and a second sidewall that are horizontally facing each other with the upper surface interposed therebetween, the first sidewall and the fin gates horizontally overlap with each other, and the upper surface and the active gates vertically overlap with each other.

17. The semiconductor device of claim 15, wherein the isolation layer includes:

first isolation portions below the fin gates;

second isolation portions below the passing gates, and the active fins are disposed between the first isolation portions and the second isolation portions, the upper surfaces of the active fins are disposed at a higher level than upper surfaces of the first isolation portions, and upper surfaces of the second isolation portions are disposed at a higher level than the upper surfaces of the active fins.

18. The semiconductor device of claim 15, wherein each of the active gates and the fin gates includes:

a first gate electrode;

a second gate electrode; and a dipole inducing layer between the first gate electrode and the second gate electrode, and the dipole inducting layer and the second gate electrode extend to be disposed over the dielectric dummy electrode of the passing gates.

19. The semiconductor device of claim 18, wherein the second gate electrode includes a material having a higher work function than a work function of the first gate electrode.

20. The semiconductor device of claim 18, wherein the first gate electrode includes titanium nitride, and the second gate electrode includes titanium silicon nitride.

21. The semiconductor device of claim 18, wherein the first gate electrode includes titanium nitride, and the second gate electrode includes titanium silicon nitride which is doped with a work function adjusting element, and the work function adjusting element includes phosphorus or arsenic.

22. The semiconductor device of claim 18, wherein the dipole inducing layer includes a lanthanum-containing material.

23. The semiconductor device of claim 18, wherein the dielectric dummy electrode includes silicon oxide, silicon nitride, or a combination thereof.

* * * * *